United States Patent
Saito

(10) Patent No.: US 10,516,827 B2
(45) Date of Patent: Dec. 24, 2019

(54) IMAGING APPARATUS, CONTROL METHOD, AND NON-TRANSITORY STORAGE MEDIUM

(71) Applicant: CANON KABUSHIKI KAISHA, Tokyo (JP)

(72) Inventor: Junichi Saito, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/031,393

(22) Filed: Jul. 10, 2018

(65) Prior Publication Data

US 2019/0045128 A1    Feb. 7, 2019

(30) Foreign Application Priority Data

Aug. 2, 2017  (JP) ................................ 2017-149668

(51) Int. Cl.
*H04N 5/232* (2006.01)
*H04N 5/357* (2011.01)

(52) U.S. Cl.
CPC ..... *H04N 5/23287* (2013.01); *H04N 5/23258* (2013.01); *H04N 5/3572* (2013.01)

(58) Field of Classification Search
CPC ............. H04N 5/23287; H04N 5/3572; H04N 5/23258; H04N 9/04557; H04N 5/232122; H04N 5/23209; H04N 5/217; H04N 5/36961; G02B 27/646; H01L 27/14643; H01L 27/14625; H01L 27/14627
See application file for complete search history.

(56) References Cited

U.S. PATENT DOCUMENTS

| | | | | |
|---|---|---|---|---|
| 8,872,962 B2* | 10/2014 | Fukuda | ..................... | G02B 7/28 348/222.1 |
| 8,988,585 B2* | 3/2015 | Hamano | ................... | G02B 7/38 348/345 |
| 9,136,294 B1* | 9/2015 | Pyeoun | ............... | H01L 27/1462 |
| 9,398,199 B2* | 7/2016 | Kimura | ................ | H04N 5/2254 |
| 9,531,960 B2* | 12/2016 | Kimura | ................ | H04N 5/2355 |
| 10,015,420 B2* | 7/2018 | Ono | ....................... | G03B 17/14 |

(Continued)

FOREIGN PATENT DOCUMENTS

| | | |
|---|---|---|
| JP | 2004-056581 A | 2/2004 |
| JP | 4567313 B2 | 10/2010 |
| JP | 2016-057474 A | 4/2016 |

*Primary Examiner* — Abdelaaziz Tissire
(74) *Attorney, Agent, or Firm* — Cowan, Liebowitz & Latman, P.C.

(57) ABSTRACT

According to an aspect of the invention, an imaging apparatus includes: a focal point detection unit configured to perform focal point detection on the basis of a phase difference between a plurality of image signals obtained by photoelectric conversion of light fluxes each passing through different pupil partial regions of an imaging optical system; an image blur compensation unit configured to compensate for image blur; and a control unit configured to set a position at which a vignetting amount occurring in a light flux passing through the imaging optical system is equal to or less than a predetermined value during a period in which the focal point detection is performed by the focal point detection unit as a center position of a driving amplitude to perform drive control of the image blur compensation unit.

13 Claims, 14 Drawing Sheets

(56) References Cited

U.S. PATENT DOCUMENTS

| | | | |
|---|---|---|---|
| 2012/0147227 A1* | 6/2012 | Yoshimura | G02B 7/346 |
| | | | 348/246 |
| 2012/0268613 A1* | 10/2012 | Nishio | G02B 7/346 |
| | | | 348/208.5 |
| 2013/0120643 A1* | 5/2013 | Tamaki | G02B 7/28 |
| | | | 348/349 |
| 2013/0271646 A1* | 10/2013 | Hamano | G03B 13/36 |
| | | | 348/350 |
| 2017/0223259 A1* | 8/2017 | Ito | H04N 5/23212 |
| 2017/0257583 A1* | 9/2017 | Yoshimura | H04N 5/351 |
| 2019/0043175 A1* | 2/2019 | Saito | H04N 5/23248 |
| 2019/0158744 A1* | 5/2019 | Saito | H04N 5/23264 |

* cited by examiner

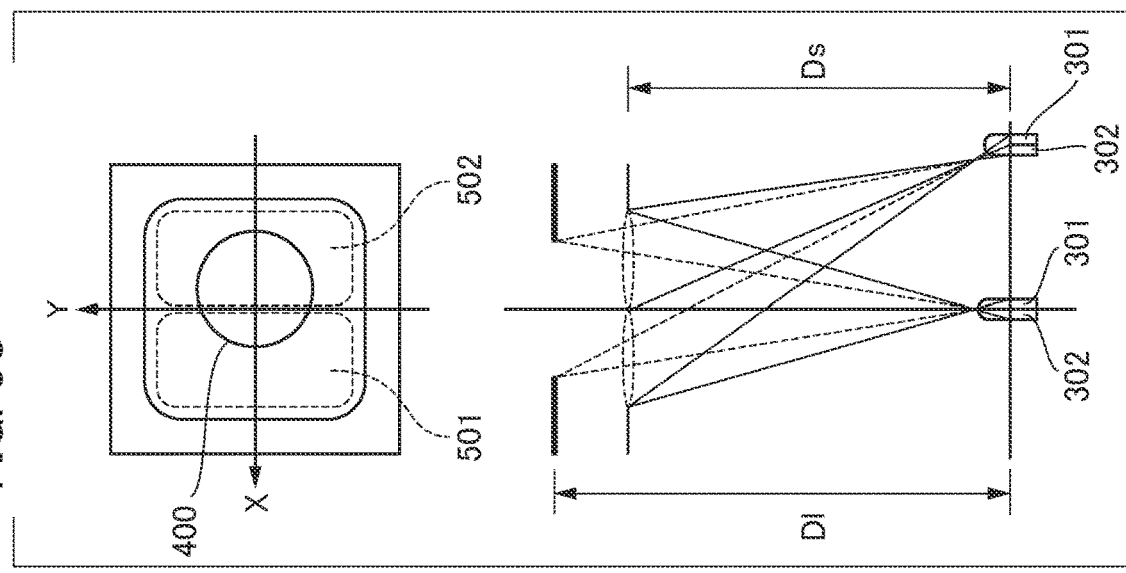
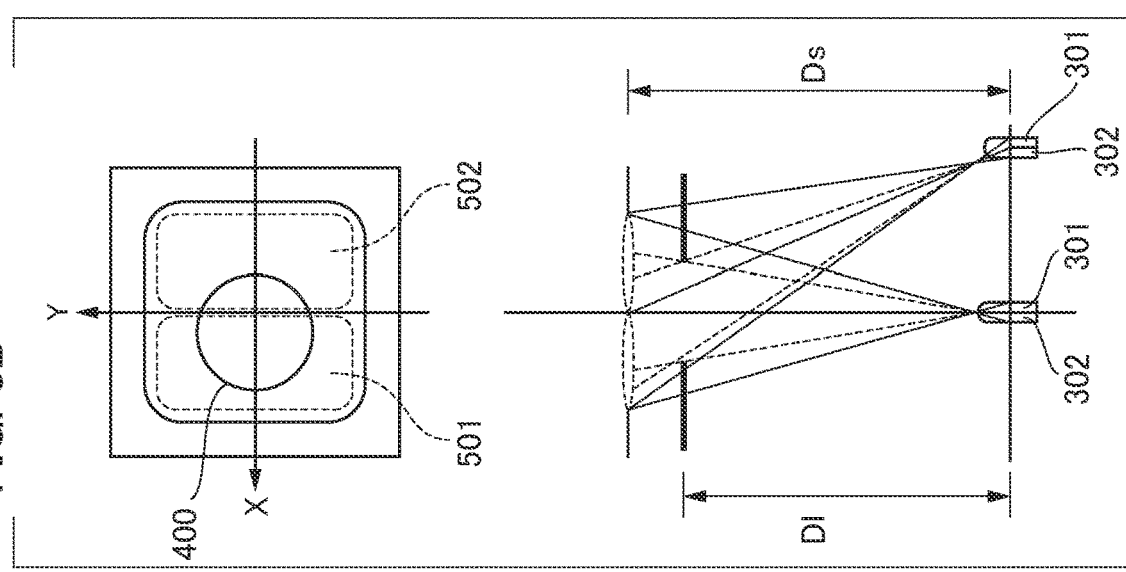
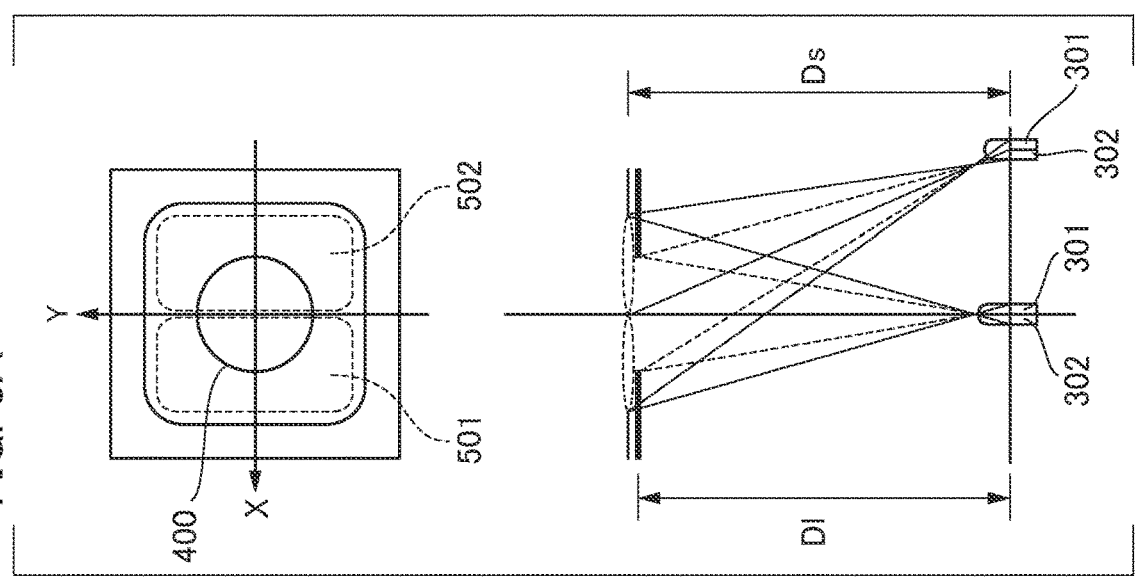

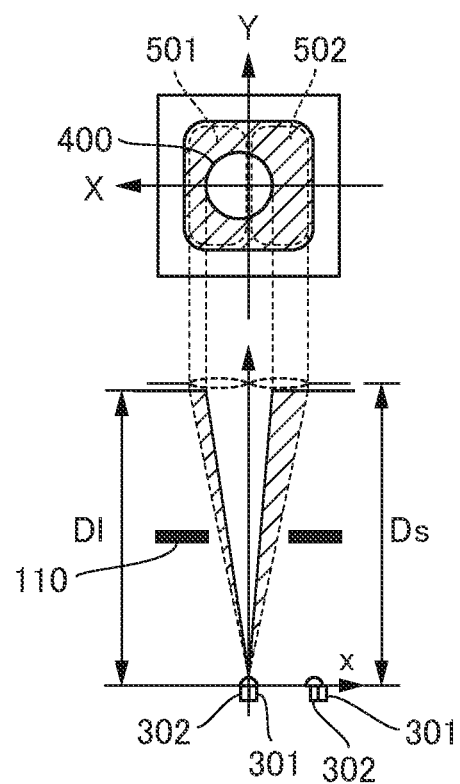
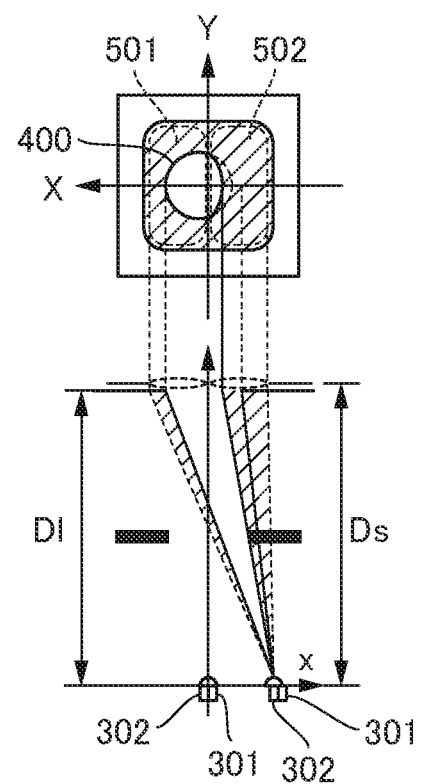

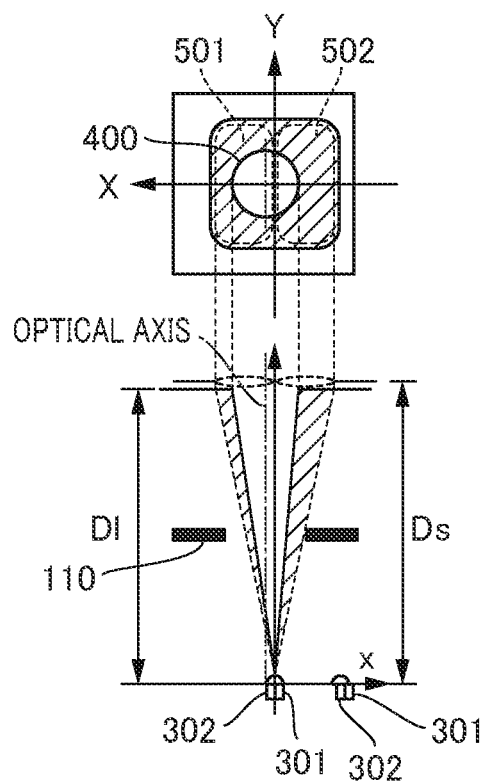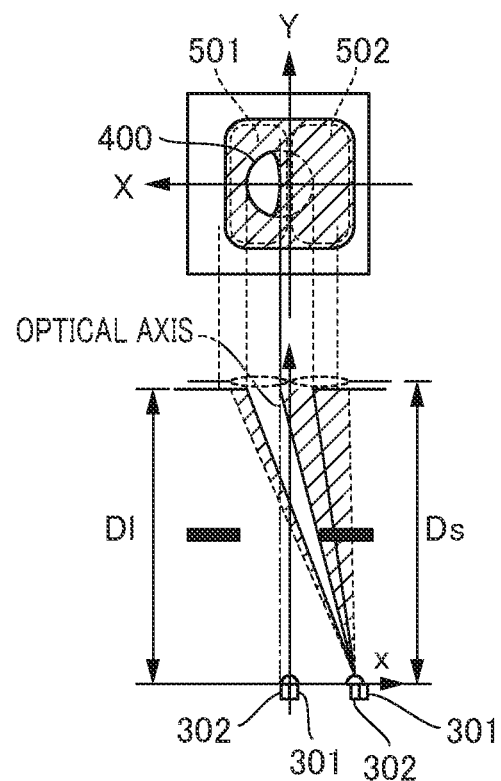

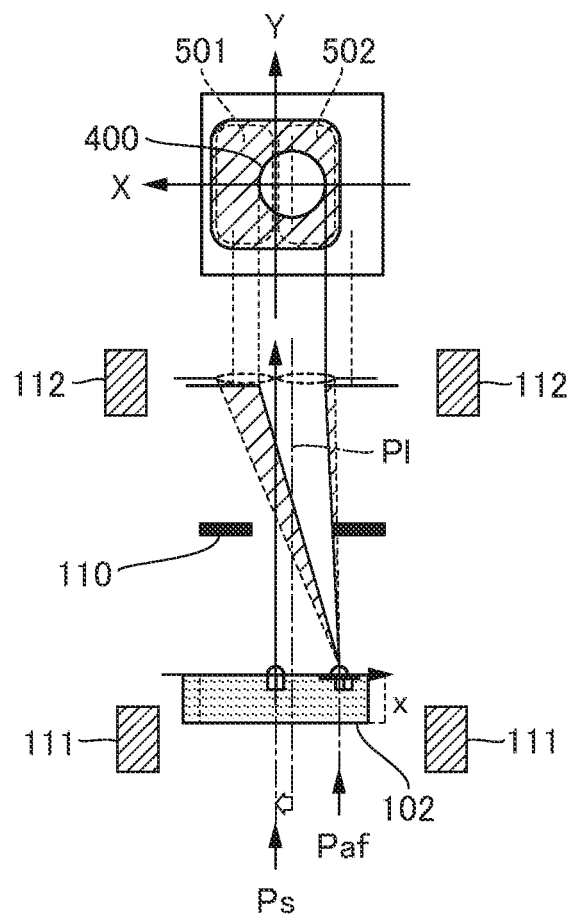
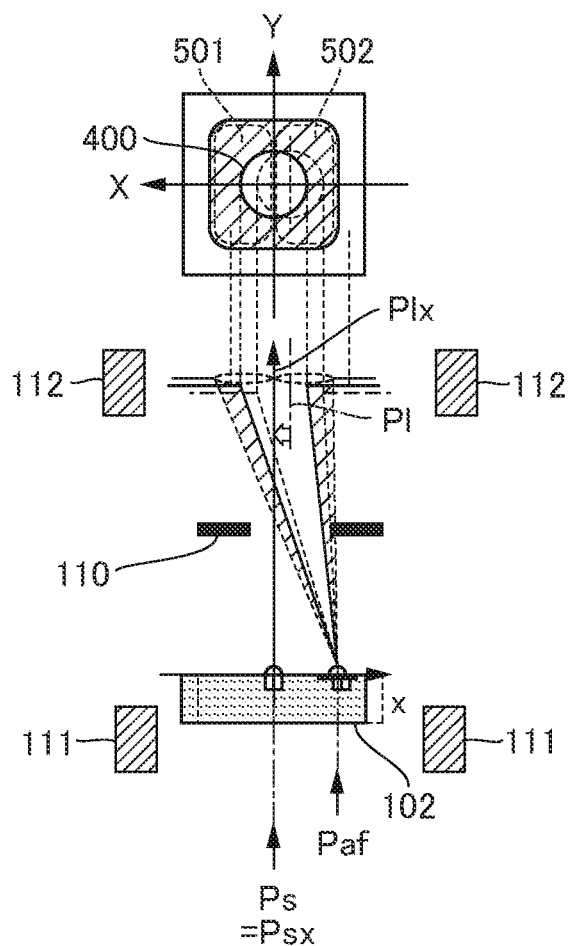

IMAGING APPARATUS, CONTROL METHOD, AND NON-TRANSITORY STORAGE MEDIUM

BACKGROUND OF THE INVENTION

Field of the Invention

The present invention relates to an imaging apparatus and a control method thereof.

Description of the Related Art

Japanese Patent Laid-Open No. 2016-57474 discloses an imaging apparatus which has an imaging element in which focal point detection pixels for performing focal point detection are disposed on the imaging surface, and performs focal point detection on the basis of a phase difference between two imaging signals obtained from different regions of the exit pupil of a photographing optical system. In addition, Japanese Patent No. 4567313 discloses a camera which performs image blur compensation by driving a part of an imaging element or a photographing optical system by allocation control.

Assisting a photographer with accurate framing by applying the image blur compensation function of the camera disclosed in Japanese Patent No. 4567313 and leaving a subject that a photographer wants to focus within a focal point detection frame in a photographing screen can be considered. However, like this camera, driving a part of an imaging element or a photographing optical system as an image blur compensation unit corresponds to a substantial change in a positional relationship between an optical axis of the photographing optical system and a center of the imaging element. Therefore, if the image blur compensation unit is driven, a state of vignetting occurring in a light flux passing through the imaging optical system changes in an equivalent manner to a change in an image height of the focal point detection frame. As a result, a light amount balance of two imaging signals used for calculating a phase difference changes and the accuracy in focal point detection lowers, and therefore, even if a photographer can be assisted with accurate framing, images which are out of focus may be photographed.

SUMMARY OF THE INVENTION

The present invention is to provide a technology for suppressing the influence of vignetting at the time of focal point detection by appropriately controlling an image blur compensation unit.

According to an aspect of the invention, an imaging apparatus comprises: a storage unit; and a controller which operates on the basis of data stored in the storage unit. The controller comprises: a focal point detection unit configured to perform focal point detection on the basis of a phase difference between a plurality of image signals obtained by photoelectric conversion of light fluxes each passing through different pupil partial regions of an imaging optical system; an image blur compensation unit configured to compensate for image blur; and a control unit configured to set a position at which a vignetting amount occurring in a light flux passing through the imaging optical system is equal to or less than a predetermined value during a period in which the focal point detection is performed by the focal point detection unit as a center position of a driving amplitude to perform drive control of the image blur compensation unit.

Further features of the present invention will become apparent from the following description of exemplary embodiments with reference to the attached drawings.

BRIEF DESCRIPTION OF THE DRAWINGS

FIGS. 8A to 8C are diagrams which describes a relationship between a pupil partial region at a peripheral image height of the imaging element and an exit pupil of an imaging optical system.

FIGS. 11A and 11B are diagrams which describes an example of the state of pupil separation on an exit pupil plane.

FIGS. 13A and 13B are diagrams which describes an example of the state of pupil separation on an exit pupil plane.

FIGS. 15A and 15B are diagrams which describes Plx and Psx.

DESCRIPTION OF THE EMBODIMENTS

Figure 1:
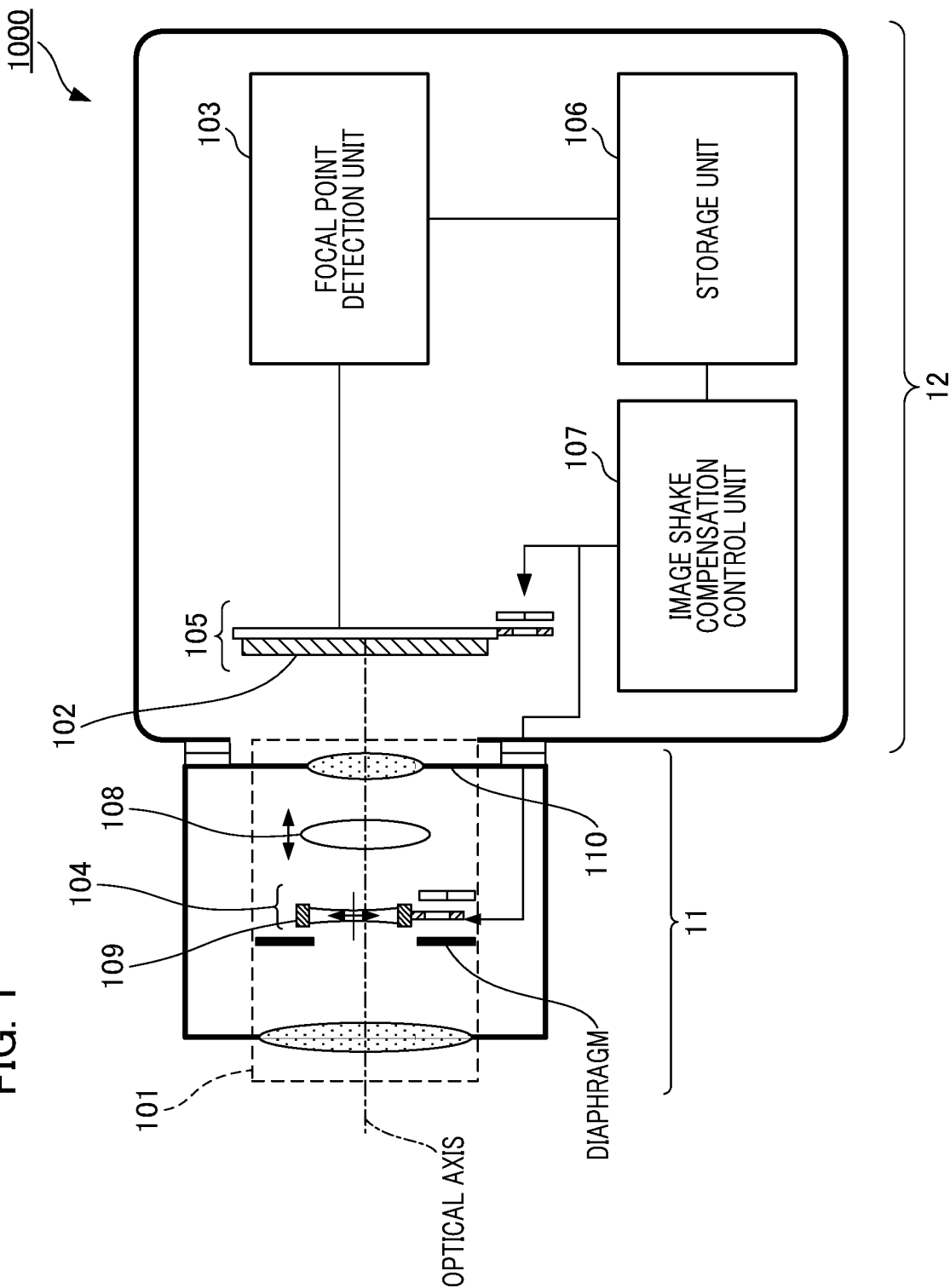
FIG. 1 is a diagram which shows a configuration example of an imaging apparatus according to the present embodiment.

FIG. 1 is a diagram which describes a configuration example of an imaging apparatus according to the present embodiment.

An imaging apparatus 1000 is a lens interchangeable-type digital camera. In the imaging apparatus 1000, a photographing optical system 101 is disposed in an attached interchangeable lens 11, and an optical path for a photographing light flux is formed. A light flux which has passed through this optical path reaches an imaging element 102 disposed in a camera main body 12, and is photo-electrically converted by a photodiode in a pixel arranged in an optical axis vertical plane of the imaging element 102. An image processing unit performs gamma processing, noise processing, and the like on signals obtained by photoelectric conversion to generate image data, and writes it in a non-volatile memory, thereby completing photographing processing once.

The imaging apparatus 1000 performs focal point detection according to an instruction of a photographer such that it can photograph an image in which a desired subject is in an in-focus state. A pixel disposed in the imaging element 102 serves as a focal point detection pixel, and a focal point detection unit 103 detects a focus state of a subject on the basis of an output of the focal point detection pixel. Specifically, the focal point detection unit 103 performs focal point detection on the basis of a phase difference between a plurality of image signals obtained by photoelectric conversion of light fluxes each passing through different pupil partial regions of the imaging optical system. The focal point detection unit 103 calculates a driving amount that the focal point adjustment optical system 108 needs to be driven in an optical axis direction on the basis of a result of the detection of a focal point state. Then, the focal point adjustment optical system 108 is driven in the optical axis direction by the driving amount by a focal point adjustment control unit (not shown). Details of the focal point detection will be described below.

In addition, the imaging apparatus 1000 includes a plurality of image blur compensation units for controlling unnecessary vibrations such as camera shake, which occurs when a photographer performs hand-held photographing. A first image blur compensation unit is a lens shift-type image blur compensation unit 104 which has an image blur compensation optical system 109 that is a part of the photographing optical system 101 disposed in the interchangeable lens 11. The image blur compensation optical system 109 is a concave lens disposed closer to an image plane side than a diaphragm. The image blur compensation control unit 107 compensates for image blur by controlling the lens shift-type image blur compensation unit 104 and shift driving the image blur compensation optical system 109 into the optical axis vertical plane.

Although image blur compensation is executed by a lens shift in the present embodiment, a method for image blur compensation is not limited to a lens shift. Image blur compensation may be executed by shaking an entire photographing optical system 101, and image blur compensation may also be executed by a prism angle change of a variable prism which is a part of the photographing optical system 101.

A second image blur compensation unit is a sensor shift-type image blur compensation unit 105 which performs image blur compensation by holding the imaging element 102 to be movable in an optical axis vertical plane by driving the imaging element 102. In the present embodiment, a region in which image blur compensation is possible is enlarged and an image to be photographed is stabilized by using two image blur compensation units. A holding frame 110 is a mechanical structure of a lens barrel which holds a final group of the photographing optical system 101. In a high image height region or the like which is spaced away from the optical axis of the imaging element, so-called "vignetting" in which a photographing light flux is blocked by a mechanical structure such as the holding frame 110 occurs and affects focal point detection. Therefore, the imaging apparatus 1000 controls an image blur compensation unit using information related to vignetting stored in the storage unit 106 at the time of focal point detection. Vignetting will be described below.

(Imaging Surface Phase Difference Focal Point Detection System)

Next, focal point detection executed by the imaging apparatus 1000 will be described with reference to FIGS. 2 to 9.

Figure 2:
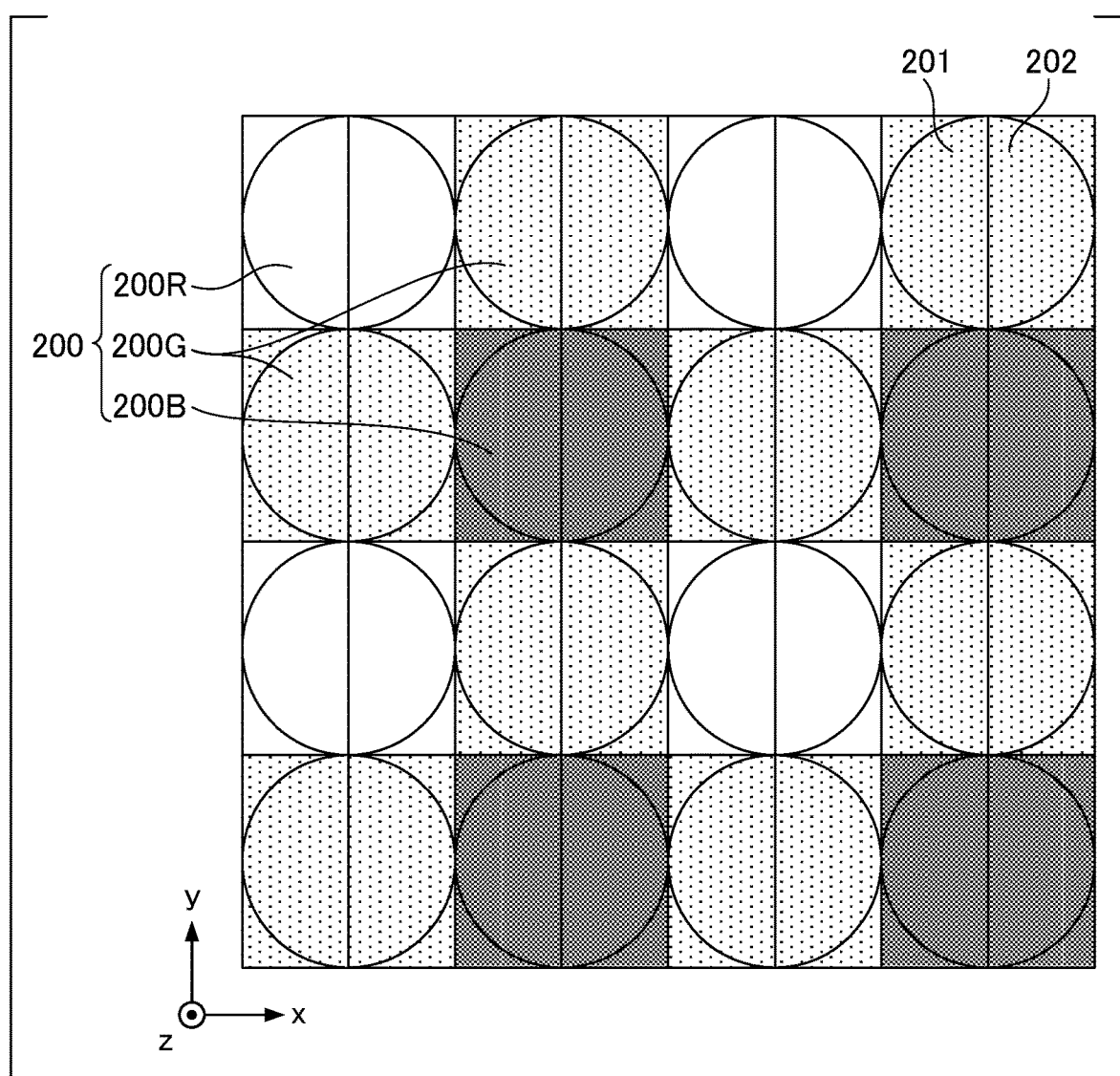
FIG. 2 is an example of a pixel array of an imaging element.

FIG. 2 is a diagram which shows a pixel array of the imaging element 102 of the imaging apparatus 1000 in a range of 4 columns×4 rows and a focal point detection pixel array in a range of 8 columns×4 rows.

In a pixel group 200 of two columns×2 rows shown in FIG. 2, a pixel 200R having spectral sensitivity of R (red) is disposed at the upper left position. Moreover, pixels 200G having spectral sensitivity of G (green) are disposed at the upper right and lower left positions. Furthermore, a pixel 200B having spectral sensitivity of B (blue) is disposed at the lower right position. Each pixel has a first focal point detection pixel 201 and a second focal point detection pixel 202 that are arranged in two columns×1 row.

By disposing a large number of pixels of 4 columns×4 rows (focal point detection pixels of 8 columns×4 rows) shown in FIG. 2 on a plane, a captured image (a focal point detection signal) can be acquired. In the present embodiment, an imaging element in which a pixel period P is 4 μm, the number of pixels N is 5575 horizontal columns×3725 vertical rows=about 20.75 million pixels, a column direction period PAF of focal point detection pixels is 2 μm, and the number of focal point detection pixels NAF is 11150 horizontal columns×3725 vertical rows=about 41.50 million pixels will be described.

FIG. 3 is a diagram which describes a configuration example of a pixel of the imaging element.

Figure 3A:
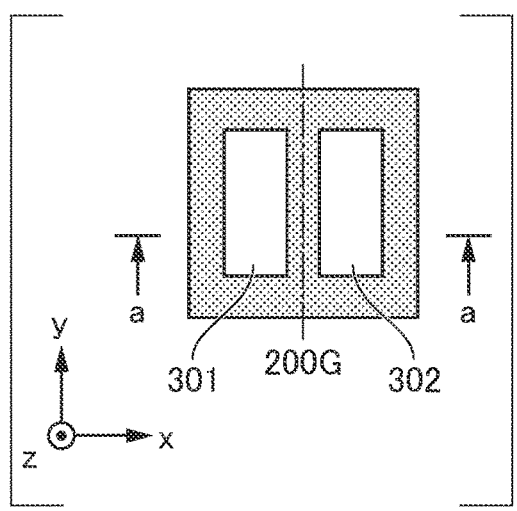
FIGS. 3A and 3B are diagrams which describes a configuration example of a pixel of the imaging element.
Figure 3B:
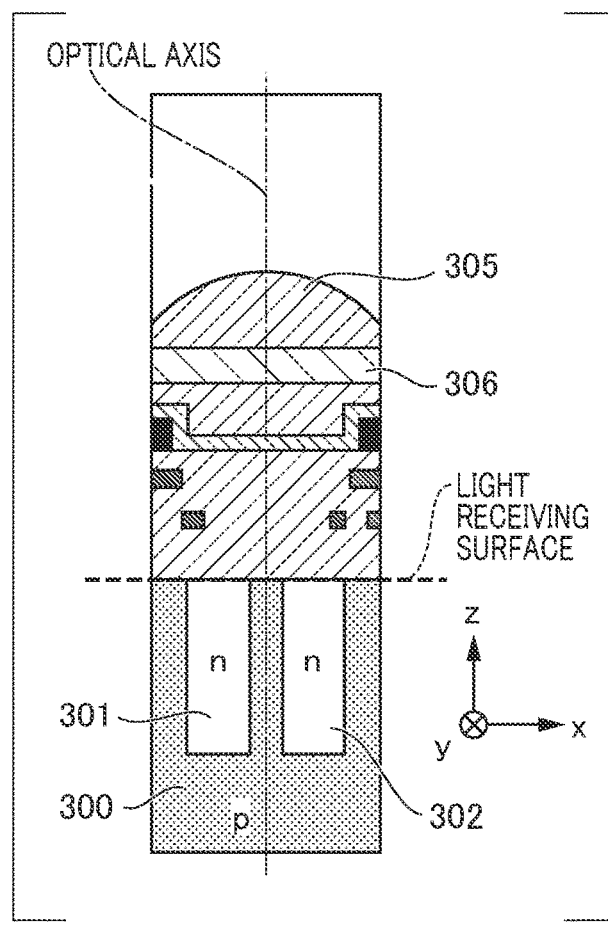

FIG. 3A shows a state of one of the pixels 200G of the imaging element 102 shown in FIG. 2 as viewed from a light-receiving surface side (+z side) of the imaging element 102. FIG. 3B shows a state of a cross-section taken along line a-a in FIG. 3A as viewed from a −y side. An "optical axis" described in FIG. 3B indicates an optical axis of a microlens 305.

As shown in FIG. 3, a microlens 305 for collecting incident light is formed on a light-receiving side of each pixel, and a photoelectric conversion unit 301 and a photoelectric conversion unit 302 which are divided into NH (divided into two) in an x direction and divided into NV (one divided) in a y direction are formed in the pixels 200G. The photoelectric conversion unit 301 and the photoelectric conversion unit 302 correspond to the first focal point detection pixel 201 and the second focal point detection pixel 202, respectively. The photoelectric conversion unit 301 and the photoelectric conversion unit 302 may be pin structure photodiodes in which an intrinsic layer is superimposed between a p-type layer and an n-type layer, and, if necessary, may also be pn-junction photodiodes in which an intrinsic layer is omitted.

In each pixel, a color filter 306 is formed between the microlens 305 and the photoelectric conversion unit 301 and the photoelectric conversion unit 302. In addition, a spectral transmittance of the color filter may change for each pixel, or the color filter may be omitted if necessary.

Light incident on the pixel 200G is collected by the microlens 305, separated by the color filter 306, and received by the photoelectric conversion unit 301 and the photoelectric conversion unit 302. In the photoelectric conversion unit 301 and the photoelectric conversion unit 302, pairs of electrons and holes are generated in accordance with an amount of received light, separated by a depletion layer, and then electrons having negative charges are accumulated on an n-type layer (not shown). On the other hand, holes are discharged to the outside of the imaging element through a p-type layer connected to a constant voltage source (not shown). The electrons accumulated on an n-type layer (not shown) of the photoelectric conversion unit 301 and the photoelectric conversion unit 302 are transferred to an electrostatic capacitance unit (FD) via a transfer gate, and converted into voltage signals.

Figure 4:
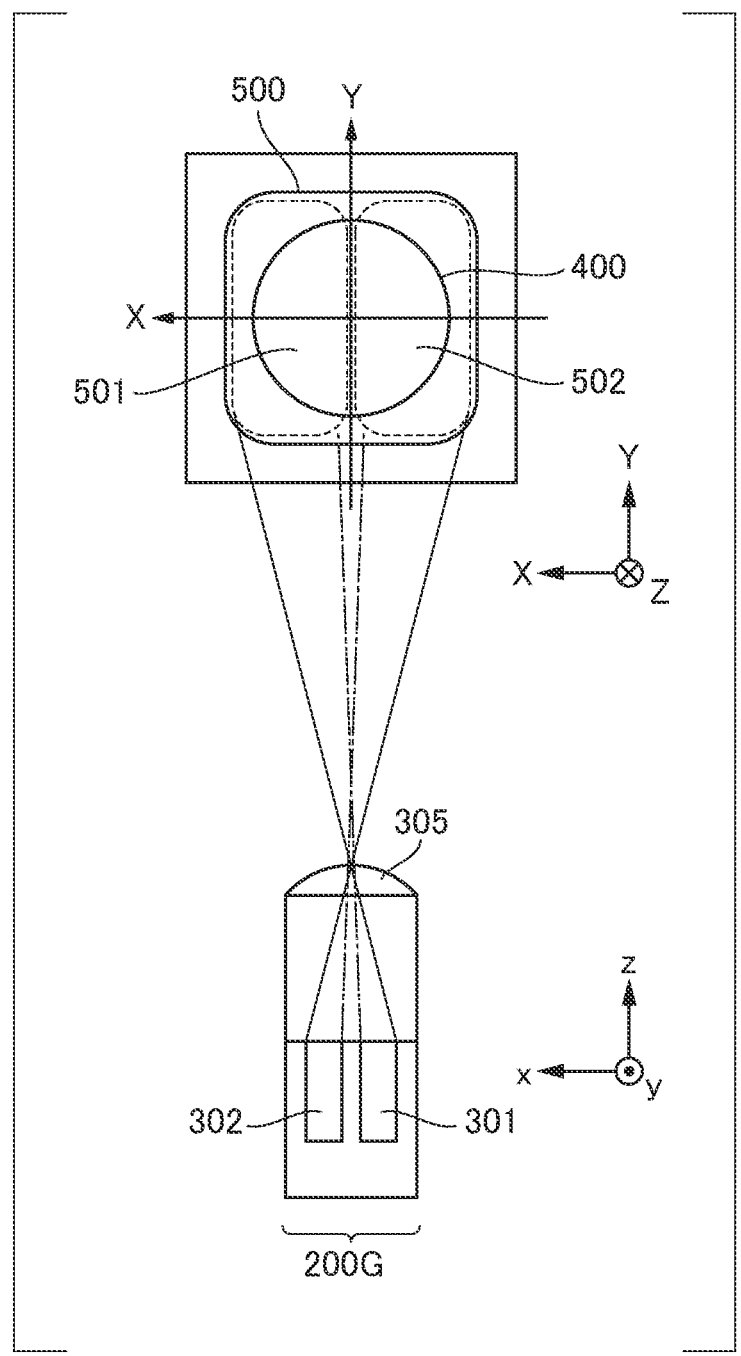
FIG. 4 is a diagram which describes a corresponding relationship between a pupil division and a pixel structure of the imaging element.

FIG. 4 is a diagram which describes a corresponding relationship between a pixel structure of the imaging element and pupil division.

FIG. 4 shows the a-a cross-section of a pixel structure shown in FIG. 3A from a +y side, and an exit pupil plane of the photographing optical system 101. An x axis and a y axis of the cross-section are inverted with respect to FIG. 3 to correspond to coordinate axes of the exit pupil plane.

A first pupil partial region 501 of the first focal point detection pixel 201 has a substantially conjugated relationship with a light-receiving surface of the photoelectric conversion unit 301 whose center of gravity is deviated in a −x direction by a microlens 305, and represents a pupil region in which light can be received by the first focal point detection pixel 201. The first pupil partial region 501 of the first focal point detection pixel 201 has a center of gravity deviated to a +X side on the pupil plane.

A second pupil partial region 502 of the second focal point detection pixel 202 has a substantially conjugated relationship with a light-receiving surface of the photoelectric conversion unit 302 whose center of gravity is deviated in a +x direction by the microlens 305, and represents a pupil region in which light can be received by the second focal point detection pixel 202. The second pupil partial region 502 of the second focal point detection pixel 202 has a center of gravity deviated to a −X side on the pupil plane. The exit pupil 400 is formed by the diaphragm opening of the photographing optical system 101, and a light flux inside a region of the exit pupil 400 reaches the imaging element 102. In addition, the pupil region 500 is a pupil region which can receive light using an entire pixel 200G obtained by combining the photoelectric conversion unit 301 and the photoelectric conversion unit 302 (the first focal point detection pixel 201 and the second focal point detection pixel 202).

Figure 5:
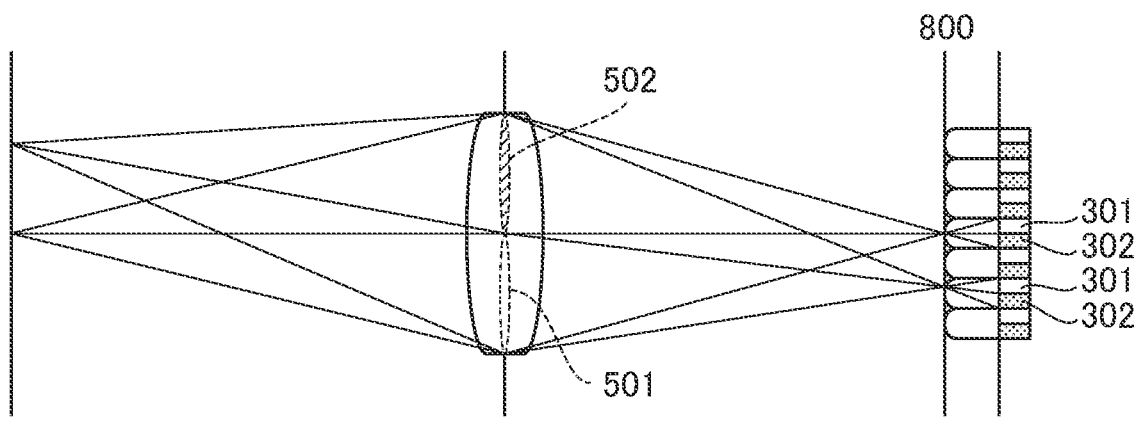
FIG. 5 is a diagram which describes a corresponding relationship between an imaging element and pupil division.

FIG. 5 is a diagram which describes a corresponding relationship between an imaging element and pupil division.

Light fluxes which have passed through different pupil partial regions such as the first pupil partial region 501 and the second pupil partial region 502 are incident on respective pixels of the imaging element 102 at different angles, and received by the first focal point detection pixel 201 and the second focal point detection pixel 202 obtained by 2×1 division. In the present embodiment, a pupil region is divided into two portions in a horizontal direction. If necessary, pupil division may also be performed in a vertical direction.

In the imaging element 102, the first focal point detection pixel 201 which receives a light flux passing through the first pupil partial region of the photographing optical system 101 and the second focal point detection pixel 202 which receives a light flux passing through the second pupil partial region of the photographing optical system 101 which is different from the first pupil partial region are arranged in a plural manner. In addition, the imaging element 102 has a plurality of arranged imaging pixels which receive a light flux passing through a pupil region obtained by combining the first pupil partial region and the second pupil partial region of the photographing optical system 101. In the present embodiment, each imaging pixel is constituted by the first focal point detection pixel and the second focal point detection pixel. The imaging apparatus 1000 collects light-receiving signals of the first focal point detection pixel 201 of respective pixels of the imaging element 102 to generate a first focus signal. In addition, the imaging apparatus 1000 collects a light-receiving signal of the second focal point detection pixel 202 of respective pixels to generate a second focus signal. Then, the imaging apparatus 1000 performs focal point detection on the basis of the first focus signal and the second focus signal. Moreover, the imaging apparatus 1000 generates an imaging signal with a resolution of the number of effective pixels N by adding signals of the first focal point detection pixel 201 and the second focal point detection pixel 202 for each pixel of the imaging element 102.

Figure 6:
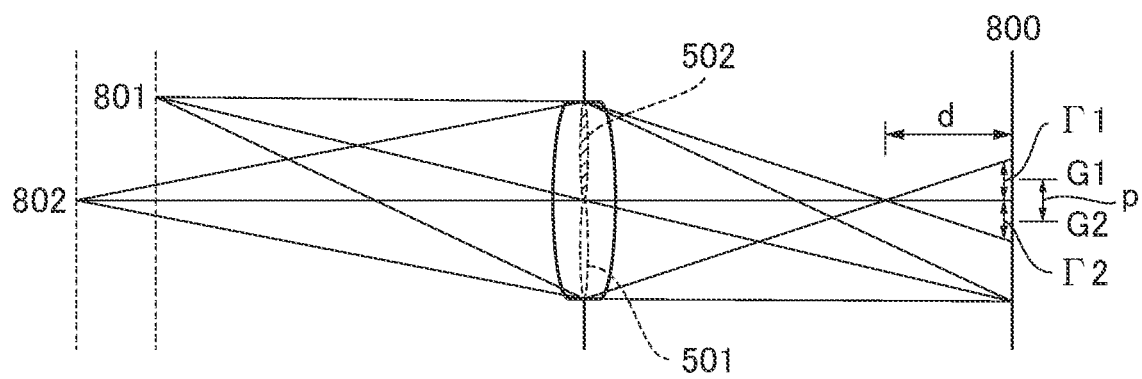
FIG. 6 is a diagram which describes a relationship between a defocus amount and an image shift amount.

FIG. 6 is a diagram which describes a relationship between defocus amount of a first focal point detection signal and a second focal point detection signal and an image shift amount between the first focal point detection signal and the second focal point detection signal.

The imaging element 102 (not shown) of the imaging apparatus 1000 is disposed on an imaging surface 800, and an exit pupil of the photographing optical system 101 is divided into two of a first pupil partial region 501 and a second pupil partial region 502 as in FIGS. 4 and 5.

For a defocus amount d, a distance from an image forming position of a subject to an imaging surface is set as a magnitude |d|, and a front-pin state in which the image forming position of a subject is closer to a subject side than the imaging surface is defined as a negative sign (d<0). In addition, the defocus amount d in a post-pin state in which the image forming position of a subject is closer to an opposite side of a subject than the imaging surface is defined as a positive sign (d>0).

In an in-focus state in which the image forming position of a subject is on the imaging surface (a focused position), d=0. In FIG. 6, a subject 801 is in the in-focus state (d=0). A subject 802 is in the front-pin state (d<0). The front-pin state (d<0) and the post-pin state (d>0) are defocus states (|d|>0).

In the front-pin state (d<0), a light flux which has passed through the first pupil partial region 501 (the second pupil partial region 502) among light fluxes from the subject 802 is collected once, spreads with a width Γ1 (or Γ2) around a center of gravity position G1 (or G2) of the light flux, and becomes a blurred image on the imaging surface 800. The blurred image is received by the first focal point detection pixel 201 (or the second focal point detection pixel 202) constituting respective pixels arrayed in an imaging element 102, and the first focal point detection signal (or the second focal point detection signal) is generated. Therefore, the first focal point detection signal (or the second focal point detection signal) is recorded as a subject image in which the subject 802 is blurred in the width Γ1 (or Γ2) at the center of gravity position G1 (or G2) on the imaging surface 800. The blurring width Γ1 (or Γ2) of a subject image increases substantially in proportion to an increase in the magnitude |d| of the defocus amount d. In the same manner, a magnitude p of an image shift amount p of a subject image between the first focal point detection signal and the second focal point detection signal (=a difference (G1-G2) at the center of gravity position of a light flux) also substantially increases as the magnitude |d| of the defocus amount d increases. In the post-pin state (d>0), an image shift direction of a subject image between the first focal point detection signal and the second focal point detection signal is opposite to that in the front-pin state, but there is a similar tendency. Therefore, as a magnitude of the defocus amount of the first focal point detection signal and the second focal point detection signal, or an imaging signal obtained by adding the first focal point detection signal and the second focal point detection signal increases, a magnitude of the image shift amount between the first focal point detection signal and the second focal point detection signal increases.

The imaging apparatus according to the present embodiment performs focal point detection of a phase difference method using a relationship between the defocus amount and the image shift amount of the first focal point detection signal and the second focal point detection signal. Specifically, the focal point detection unit 103 relatively shifts the first focal point detection signal and the second focal point detection signal to calculate a correlation amount representing a degree of coincidence of the signals, and detects an image shift amount from a shift amount at which the correlation is improved. The focal point detection unit 103 performs focal point detection by converting an image shift amount into a detection defocus amount on the basis of a relation in which the magnitude of the image shift amount between the first focal point detection signal and the second focal point detection signal increases as the magnitude of the defocus amount of the imaging signal increases.

Figure 7:
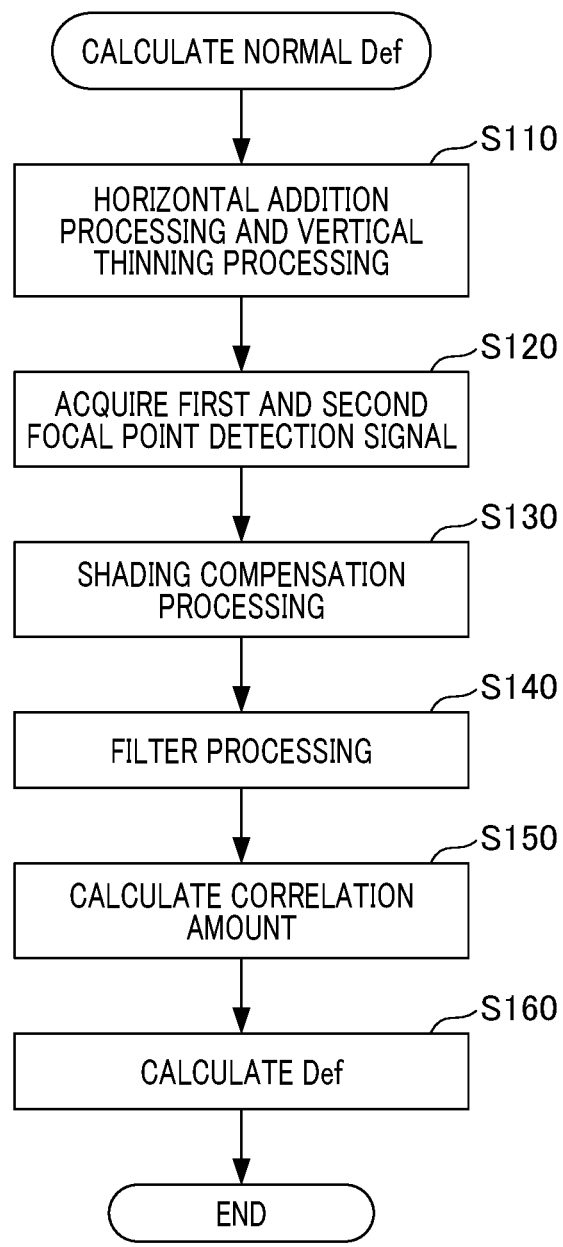
FIG. 7 is a flowchart which describes an example of focal point detection processing.

FIG. 7 is a flowchart which describes an example of focal point detection processing.

In S110, the focal point detection unit 103 performs three pixel addition processing on each of the first focal point detection signal and the second focal point detection signal in a column direction to suppress a signal data amount. In addition, the focal point detection unit 103 performs Bayer (RGB) addition processing to convert RGB signals into luminance Y signals. In addition, the focal point detection unit 103 reads out one row every three rows to execute vertical thinning processing. In the present embodiment, horizontal addition and vertical thinning processing are performed after being read from the imaging element 102, but the horizontal addition and vertical thinning processing may also be performed in the imaging element 102 in advance.

In S120, the focal point detection unit 103 sets a focal point detection region which is subjected to focal point adjustment from an effective pixel region of the imaging element 102. The focal point detection unit 103 generates a first focal point detection signal from a light-receiving signal of the first focal point detection pixel in the focal point detection region, and generates a second focal point detection signal from a light-receiving signal of the second focal point detection pixel in the focal point detection region.

Next, the focal point detection unit 103 performs shading compensation processing on each of the first focal point detection signal and the second focal point detection signal in S130. In the following, shading caused by a pupil shift of the first focal point detection signal and the second focal point detection signal will be described.

FIG. 8 is a diagram which describes a relationship between a pupil partial region at a peripheral image height of the imaging element and an exit pupil of the imaging optical system.

In FIG. 8, a relationship among the first pupil partial region 501 of the first focal point detection pixel 201, the second pupil partial region 502 of the second focal point detection pixel 202, and the exit pupil 400 of the photographing optical system 101, which are at the peripheral image height of the imaging element 102, will be described as an example. FIG. 8A shows a state in which an exit pupil distance D1 of the photographing optical system 101 is the same as a set pupil distance Ds of the imaging element 102. In this state, the exit pupil 400 of the photographing optical system 101 is substantially equally pupil-divided by the first pupil partial region 501 and the second pupil partial region 502. FIG. 8B shows a state in which the exit pupil distance D1 of the photographing optical system 101 is shorter than the set pupil distance Ds of the imaging element 102. In this state, a pupil shift between the exit pupil 400 and an entrance pupil of the imaging element 102 occurs at the peripheral image height of the imaging element 102, and the exit pupil 400 is unevenly pupil-divided. FIG. 8C shows a state in which the exit pupil distance D1 of the photographing optical system 101 is longer than the set pupil distance Ds of the imaging element 102. In this state, a pupil shift between the exit pupil 400 and the entrance pupil of the imaging element 102 occurs at the peripheral image height of the imaging element 102, and the exit pupil 400 is unevenly pupil-divided. As pupil division is unevenly performed at the peripheral image height, the intensity of the first focal point detection signal and the second focal point detection signal also becomes uneven, and shading in which the intensity of one of the first focal point detection signal and the second focal point detection signal increases and the intensity of the other decreases occurs.

Returning to description of FIG. 7, in S130, the focal point detection unit 103 generates a first shading compensation coefficient of the first focal point detection signal and a second shading compensation coefficient of the second focal point detection signal. The focal point detection unit 103 generates the first shading compensation coefficient and the second shading compensation coefficient in accordance with an image height of the focal point detection region, an F value (a diaphragm value) of the photographing optical system 101, an exit pupil distance, and a vignetting state of an exit pupil light flux. The focal point detection unit 103 performs shading compensation processing of the first focal point detection signal and the second focal point detection signal by multiplying the first focal point detection signal by the first shading compensation coefficient and multiplying the second focal point detection signal by the second shading compensation coefficient.

In the focal point detection of a phase difference method, detection defocus amount detection is performed on the basis of the correlation between the first focal point detection signal and the second focal point detection signal. If shading caused by a pupil shift occurs, the correlation between the first focal point detection signal and the second focal point detection signal may decrease in some cases. Therefore, in the focal point detection in the phase difference method, it is desired to perform shading compensation processing (optical compensation processing) to improve the correlation between the first focal point detection signal and the second focal point detection signal (coincidence of signal) and to improve focal point detection performance. Although not shown in FIG. 8, in addition to the opening constituting the exit pupil 400, there is a mechanical member holding each optical system or a mechanical member in the camera main body from the final group of the interchangeable lens 11 to the imaging element 102. Depending on a diaphragm value, an image height, or the like, these mechanical members blocks a light flux passing through the imaging optical system, and, in general, this is referred to as "vignetting" of a light flux.

The shading of the first focal point detection signal and the second focal point detection signal is caused by vignetting, and it is possible to prevent degradation of focal point detection accuracy by performing shading compensation with regard to vignetting under a condition that vignetting is known. In the imaging apparatus 1000, a shading compensation coefficient SHD is stored in the storage unit 106 as a table corresponding to an image height of a focal point detection region, and an F value (a diaphragm value), an exit pupil distance, and a vignetting state of the photographing optical system 101. The shading compensation coefficient SHD corresponds to an intensity ratio of a plurality of image signals obtained from different regions of an exit pupil of the photographing optical system. Since the exit pupil distance is different for each interchangeable lens (for each zoom state in the case of a zoom lens), each corresponding table is provided. In addition, since the vignetting state changes according to a position of the image blur compensation optical system 109, the state is represented by having a shading compensation coefficient SHD for each stroke amount of the image blur compensation optical system 109. The imaging apparatus 1000 has vignetting information by having a table of a different shading compensation coefficient SHD for each stroke amount of the lens shift-type image blur compensation unit 104. A position of the imaging element 102 in which the sensor shift-type image blur compensation unit 105 is driven can be regarded as a simple change in image height of a focal point detection region. Therefore, the imaging apparatus 1000 does not hold a shading compensation coefficient table for each position of the imaging element 102. The imaging apparatus 1000 holds, for example, a relative positional relationship can be taken by a drive of the lens shift-type image blur compensation unit 104 and the sensor shift-type image blur compensation unit 105 as a stroke amount of the image blur compensation optical system 109 described above. In S140, the focal point detection unit 103 performs filter processing on the first focal point detection signal and the second focal point detection signal.

Figure 9:
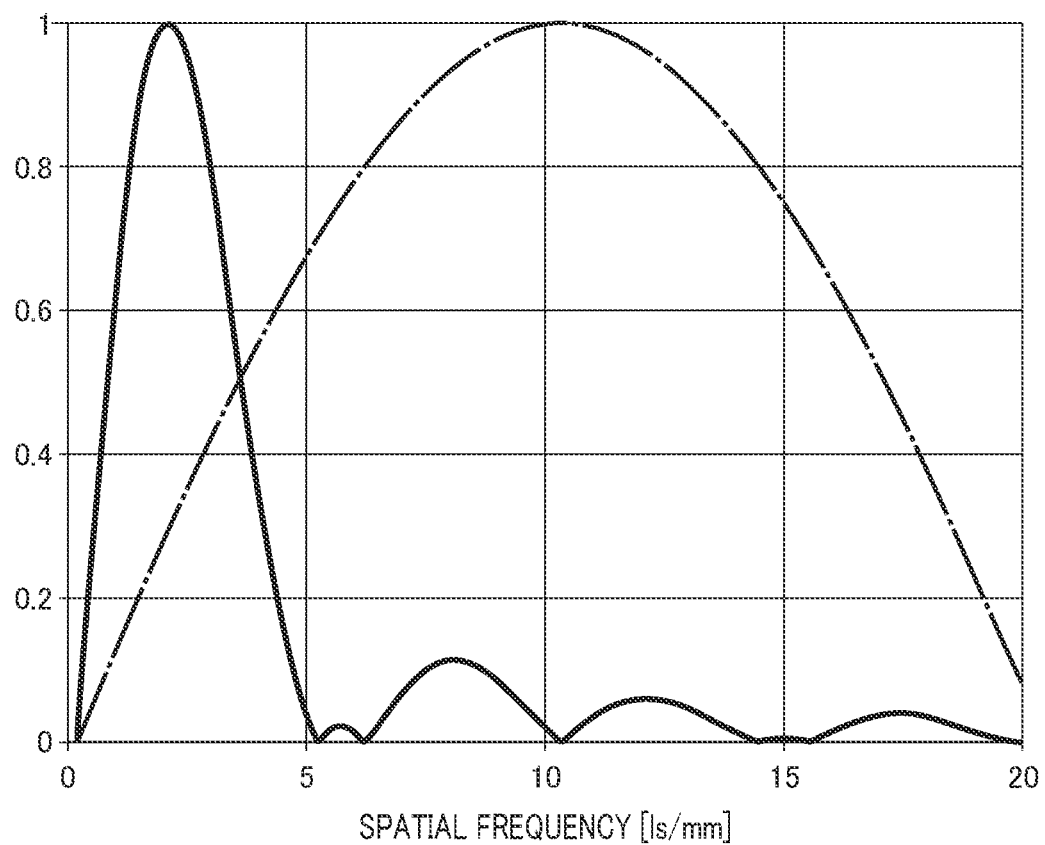
FIG. 9 is a diagram which describes a passband example of filter processing.

FIG. 9 is a diagram which describes a passband example of the filter processing.

A solid line of FIG. 9 indicates a passband of the filter processing. In the present embodiment, since focal point detection in a large defocus state is performed by focal point detection of a phase difference method, the passband of filter processing is configured to include a low frequency band. When focal point adjustment is performed from in a large defocus state to a small defocus state, the passband of filter processing at the time of focal point detection may be adjusted to a higher frequency, band in accordance with a defocus state as indicated by a one-dot chain line of FIG. 9.

Next, in step S150 of FIG. 7, the focal point detection unit 103 performs shift processing of shifting a first focal point detection signal and a second focal point detection signal after filter processing relatively in a pupil division direction, and calculates a correlation amount representing a degree of coincidence of the signals. A $k^{th}$ first focal point detection signal after filter processing is set as $A(k)$, a $k^{th}$ second focal point detection signal is set as $B(k)$, and a range of a number k corresponding to a focal point detection region is set as W. A shift amount by shift processing is set as $s_1$, a shift range of the shift amount $s_1$ is set as $\Gamma 1$, a correlation amount COR is calculated by Equation (1).

$$COR(s_1) = \sum_{k \in W} |A(k) - B(k - s_1)|, s_1 \in \Gamma 1 \quad (1)$$

The focal point detection unit 103 performs corresponding subtraction on the $k^{th}$ first focal point detection signal $A(k)$ and the $(k-s_1)^{th}$ second focal point detection signal $B(k-s_1)$ to generate a shift subtraction signal according to first shift processing of the shift amount $s_1$. The focal point detection unit 103 calculates an absolute value of the generated shift subtraction signal, and calculates a correlation amount (a first evaluation value) COR ($s_1$) with a sum of the number k within a range W corresponding to a focal point detection region. If necessary, a correlation amount (a first evaluation value) calculated for each row may be added over a plurality of rows for each shift amount.

In S160, the focal point detection unit 103 calculates a shift amount of a real value at which a correlation amount is a minimum value from the correlation amounts by a sub-pixel operation and sets it as an image shift amount p1. The focal point detection unit 103 multiplies the image shift amount p1 by an image height of the focal point detection region and a conversion coefficient K in accordance with the F value, exit pupil distance and vignetting information of the photographing optical system 101, and detects a detection defocus amount (Def). That is, a phase difference of a plurality of image signals is converted into a defocus amount according to a conversion coefficient K. The conversion coefficient K exists as table data stored in the storage unit 106 of the imaging apparatus 1000. A table of the conversion coefficient K is provided as a table in accordance with an exit pupil distance for each interchangeable lens, like a table of the shading compensation coefficient SHD. In the same manner, for the vignetting state, the conversion coefficient K is described for each stroke amount of the image blur compensation optical system 109. The imaging apparatus 1000 has vignetting information by having tables of different conversion coefficients K for each stroke amount of the image blur compensation optical system 109. The focal point detection unit 103 determines a driving amount of the focal point adjustment optical system 108 by multiplying a detected detection defocus amount by focus sensitivity.

The processing described with reference to FIG. 7 is performed for each frame until focal point detection for focusing confirmation is completed on the basis of an instruction by a half press operation (SW1) of a shutter button not shown in a still image photographing mode. In addition, this processing is performed for each frame in a moving image photographing mode. The image height of a focal point detection region is predicted and determined on the basis of a history of tracking (automatic selection of a focal point detection frame) in a plurality of past frames or a history of the drive positions of two image blur compensation units. The details will be described below, but an image blur compensation unit sets a position at which the vignetting effect is equal to or less than a predetermined value as a drive center and performs drive control in accordance with a position of a focal point detection frame indicating a focal point detection region in the present embodiment.

In the present embodiment, the shading compensation coefficient SHD and the conversion coefficient k are stored in a form of table in the storage unit 106, but may also be obtained by having vignetting information as a two-dimensional frame shape on the pupil plane and performing coefficient calculation in a camera on the basis of this vignetting information. The two-dimensional frame shape described above corresponds to a light flux shape on the exit pupil plane of the imaging optical system in accordance with a state of vignetting. In addition, in the present embodiment, although a location of the storage unit 106 is not particularly described, but the storage unit 106 may be provided on a camera main body 12 side and may be provided to be divided into the interchangeable lens 11 and the camera main body 12.

(Lens Shift Compensation and Pupil Division)

A relationship between driving and focal point detection of the lens shift-type image blur compensation unit 104 and the sensor shift-type image blur compensation unit 105, which are image blur compensation units of the imaging apparatus 1000, will be described with reference to FIGS. 10 to 13.

FIGS. 10 to 13 are diagrams which show examples of states of pupil division on an exit pupil plane, observed by a pixel group of a focal point detection region at the central image height or peripheral image height.

Figure 10A:
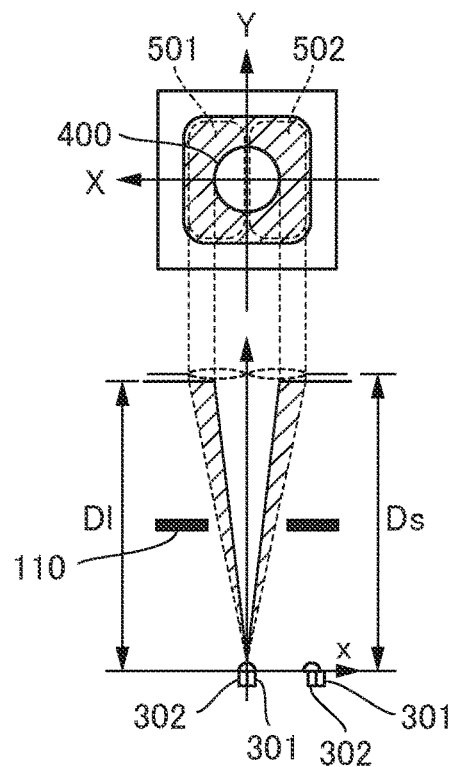
FIGS. 10A to 10D are diagrams which describes an example of a state of pupil separation on an exit pupil plane.
Figure 10B:
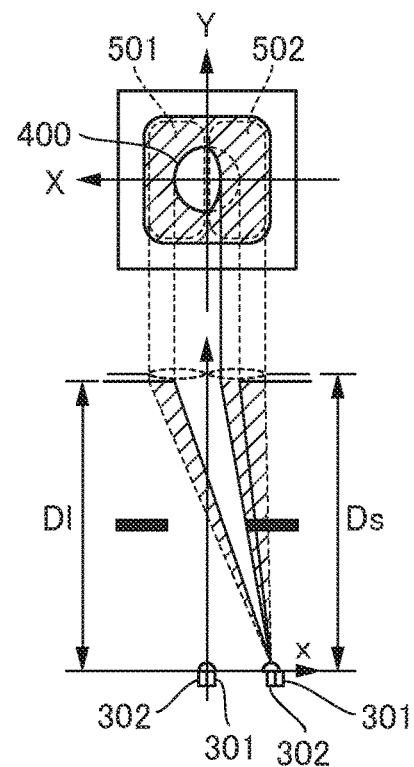
Figure 10C:
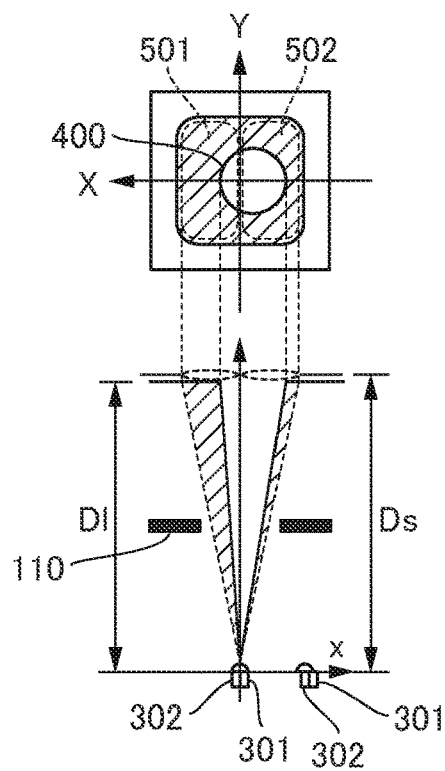
Figure 10D:
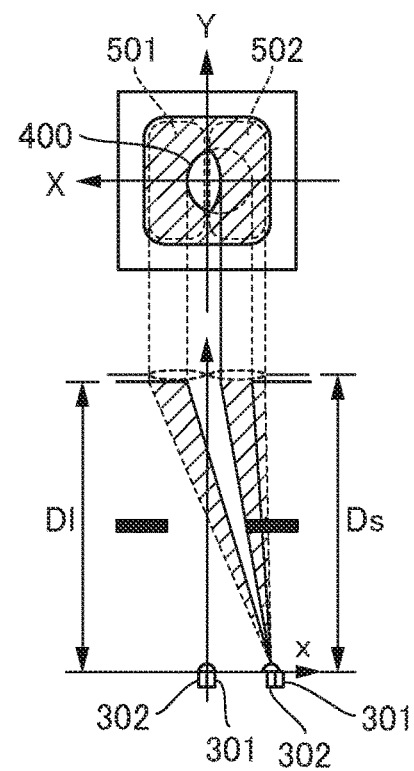

FIGS. 10A, 10C, and 11A show the states of pupil division on an exit pupil plane, observed by a pixel group in a focal point detection region at the central image height. In addition, FIGS. 10B, 10D, and 11B show the states of pupil division on an exit pupil plane, observed by a pixel group of a focal point detection region at the peripheral image height (the +X direction). In FIGS. 10 and 11, it is shown that the exit pupil distance D1 of the photographing optical system 101 is substantially equivalent to the set pupil distance Ds of the imaging element 102.

With reference to FIG. 10A, pupil division at the central image height when the image blur compensation optical system 109 of the lens shift-type image blur compensation unit 104 is positioned at the center of a drive range will be described. A circular shape shown at the center of a pupil plane in the upper part of FIG. 10A is the exit pupil 400 formed by an opening of a diaphragm of the photographing optical system 101. The central image height shows that a light flux of the exit pupil plane of the photographing optical system 101, which is a distance substantially the same as the set pupil distance of the imaging element 102, is divided substantially equally into right and left portions. A bold line disposed between the exit pupil 400 and a surface of the imaging element 102 represents the holding frame 110 of the final group of the photographing optical system 101, and vignetting caused by the holding frame 110 does not occur at the central image height.

As shown in FIG. 10B, the set pupil distance of the imaging element 102 is also substantially the same as the exit pupil distance of the photographing optical system 101 at the peripheral image height, and, if there is no holding frame 110 of the final group, the light flux of the exit pupil plane of the photographing optical system 101 can be divided substantially equally into right and left portions. However, in reality, the holding frame 110 of the final group causes vignetting to occur on one side of the light flux, and pupil division becomes unequal between right and left portions. If such vignetting occurs, the imaging apparatus 1000 performs shading compensation on the basis of vignetting information which can help to infer a vignetting state for each focal point detection signal, and executes a more accurate focal point detection calculation.

FIGS. 10C, 10D, 11A, and 11B show the states of pupil division on the exit pupil plane when the image blur compensation optical system 109 of the lens shift-type image blur compensation unit 104 is driven in the X direction. In the present embodiment, the first focal point detection pixel 201 and the second focal point detection pixel 202 constituting the imaging element 102 are disposed in an X axis direction. Therefore, a drive of the image blur compensation optical system 109 of the lens shift-type image blur compensation unit 104 in the X direction gives a large influence on pupil division for focal point detection.

In the photographing optical system 101, the lens shift-type image blur compensation unit 104 performs image blur compensation by shifting one concave lanes (the image blur compensation optical system 109) disposed closer to the image plane side than the diaphragm into an XY plane. That is, if the image blur compensation optical system 109 is driven in the +X direction, the imaging element 102 observes the exit pupil 400 shifted in the −X direction on the pupil plane. Therefore, FIGS. 10C and 10D show the states of pupil division when the image blur compensation optical system 109 is driven in the X direction. In addition, FIGS. 11A and 11B show the states of pupil division when the image blur compensation optical system 109 is driven in the −X direction.

With reference to FIGS. 10C and 10D, an example of pupil division at a central image height when the image blur compensation optical system 109 of the lens shift-type image blur compensation unit 104 is displaced in the +X direction will be described. As described above, if the image blur compensation optical system 109 is displaced in the +X direction, the exit pupil 400 moves in the −X direction. Strictly speaking, the exit pupil 400 becomes an elliptical shape conforming to the cosine fourth law, but it is expressed as a circle for simplicity of description in this example.

In FIG. 10C, the exit pupil 400 moves in the −X direction, but the vignetting caused by the holding frame 110 of the final group of the photographing optical system 101 indicated by a bold line does not occur. However, since a diaphragm opening shape moves in the −X direction, pupil division is unevenly performed between tight and left portions, and shading caused by vignetting occurs even at the central image height. In FIG. 10D, in the same manner as in FIG. 10C, the exit pupil 400 moves in the −X direction and the vignetting caused by the holding frame 110 of the final group of the photographing optical system 101 occurs. In this case, unlike in FIG. 10B, although a vignetting amount increases, pupil division is performed more symmetrically between left and right portions than in FIG. 10C.

With reference to FIGS. 11A and 11B, states of the pupil division at the central image height and the peripheral image height (the +X direction) when the image blur compensation optical system 109 of the lens shift-type image blur compensation unit 104 is displaced in the −X direction will be described. Contrary to FIGS. 10C and 10D, if the image blur compensation optical system 109 of the lens shift-type image blur compensation unit 104 is displaced in the −X direction, the exit pupil 400 moves in the +X direction. To simplify description, the exit pupil 400 is in a circular shape. In FIG. 11A, although the exit pupil 400 moves in the +X direction, the vignetting caused by the holding frame 110 of the final group of the photographing optical system 101 does not occur. However, since the exit pupil 400 has moved in the +X direction, the pupil division is performed unequally between left and right portions, and shading caused by vignetting even at the central image height occurs.

In FIG. 11B, the vignetting caused by the holding frame 110 of the final group of the photographing optical system 101 occurs and the exit pupil 400 moves in the +X direction. In this case, unlike in FIG. 10B, although a vignetting amount decreases, the inhomogeneity of pupil division increases and a component ratio on the −X side among focal point detection signals lowers remarkably. If defocus calculation using the shading compensation or the conversion coefficient K is performed under conditions corresponding to FIGS. 10C and 11B the same as the conditions of FIGS. 10A and 10B, accurate focal point detection becomes impossible and an in-focus state cannot be reached. For example, if FIGS. 10D and 11B showing an appearance of the peripheral image height (the +X direction) are viewed, a vignetting amount caused by the holding frame 110 is less in FIG. 11B. On the other hand, in the state of FIG. 10D, although a balance of the pupil division caused by vignetting is close to equal division, an amount of transmitted light is small and an S/N of signals used for focal point detection decreases. That is, if a focal point detection frame is set at an image height in the +X direction in this manner, it is known that it is more difficult to receive the vignetting effect caused by the holding frame 110 when the image blur compensation optical system 109 is placed in a position displaced in the −X direction as shown in FIG. 11B. The image blur compensation control unit 107 specifies a set image height of a focal point detection frame and a position of the image blur compensation optical system 109 at which vignetting by a holding frame starts to occur, and sets a driving amplitude center of the image blur compensation optical system 109. Details of the setting of a driving amplitude center performed by the image blur compensation control unit 107 will be described below.

(Sensor Shift and Pupil Division)

Figure 12A:
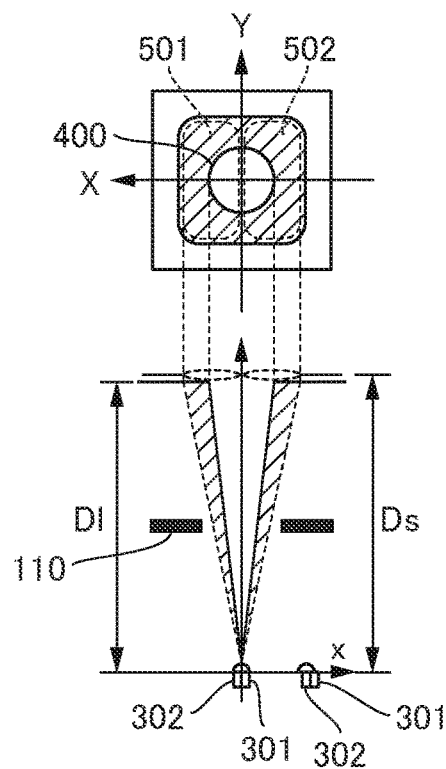
FIGS. 12A to 12D are diagrams which describes an example of the state of pupil separation on an exit pupil plane.
Figure 12B:
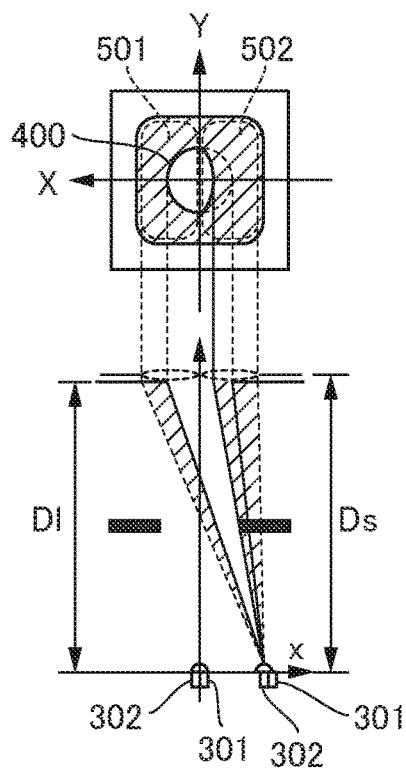
Figure 12C:
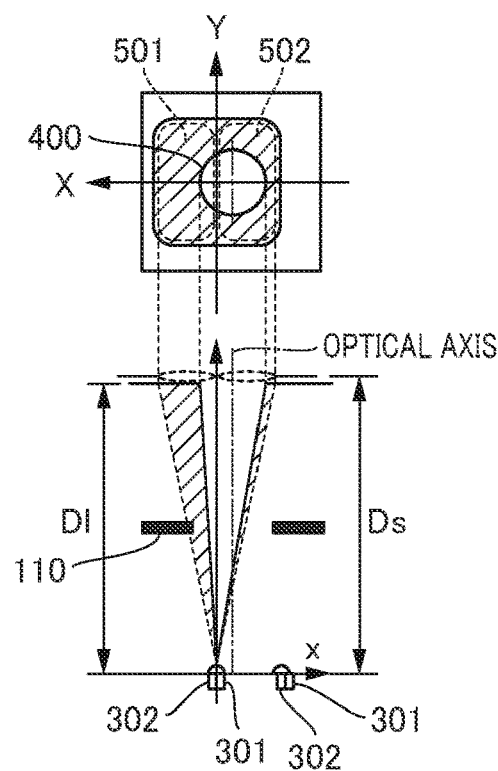
Figure 12D:
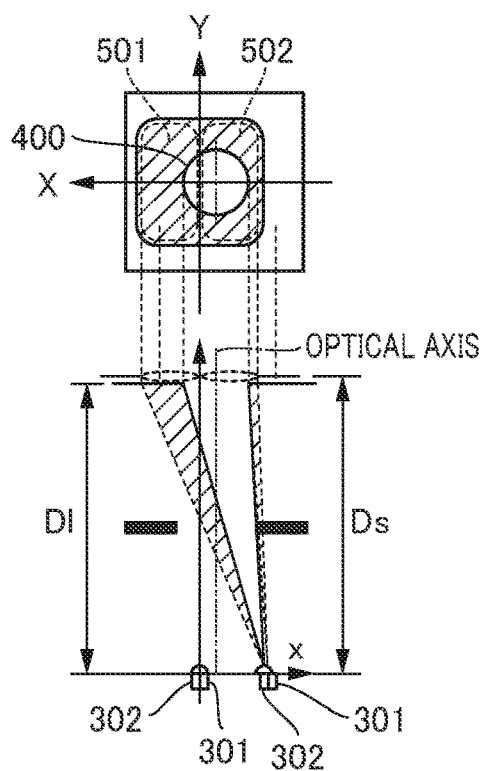

FIGS. 12A, 12C, and 13A show the states of pupil division on the exit pupil plane observed by a pixel group in a focal point detection region at the central image height. In addition, FIGS. 12B, 12D, and 13B show the states of pupil division on the exit pupil plane observed by a pixel group in a focal point detection region at the peripheral image height (the +X direction). FIGS. 12 and 13 show that the exit pupil distance D1 of the photographing optical system 101 is substantially equivalent to the set pupil distance Ds of the imaging element 102.

With reference to FIG. 12A, pupil division at the center image height when the sensor shift-type image blur compensation unit 105 is positioned at a center of a drive range will be described. A circular shape shown at a center of the exit pupil plane in the upper part of FIG. 12A is the exit pupil 400 formed by the opening of the diaphragm of the photographing optical system 101. At the central image height, a light flux of the exit pupil plane of the photographing optical system 101 which is approximately at the same distance as the set pupil distance of the imaging element 102 is divided substantially equally into left and right portions. A bold line placed between the exit pupil plane and a surface of the imaging element 102 represents the holding frame 110 of the final group of the photographing optical system 101. The vignetting caused by the holding frame 110 does not occur at the central image height.

The set pupil distance of the imaging element 102 at the peripheral image height shown in FIG. 12B is also approximately the same as the exit pupil distance of the photographing optical system 101, and, if there is no holding frame 110 of the final group, it is possible to divide the light flux of the exit pupil plane of the photographing optical system 101 substantially evenly between left and right portions. However, in fact, by the holding frame 110 of the final group, vignetting occurs on one side of the light flux, and pupil division becomes unequal between left and right portions. If such vignetting occurs, the imaging apparatus 1000 performs shading compensation on each focal point detection signal on the basis of vignetting information which helps to infer a vignetting state, and executes more accurate focal point detection calculation.

FIGS. 12C, 12D, 13A, and 13B show the states of pupil division on the exit pupil plane when the sensor shift-type image blur compensation unit 105 is driven in X direction. The sensor shift-type image blur compensation unit 105 can drive the imaging element 102 in the XY plane. In the present embodiment, the first focal point detection pixel 201 and the second focal point detection pixel 202 constituting the imaging element 102 are disposed in the X axis direction. Therefore, the drive of the imaging element 102 of the sensor shift-type image blur compensation unit 105 in the X direction gives a large influence on pupil division for focal point detection. If the imaging element 102 is driven in the +X direction, the imaging element 102 observes the exit pupil 400 shifted in the +X direction on the pupil plane. Therefore, FIGS. 12C and 12D show pupil division when the imaging element 102 is driven in the −X direction, FIGS. 13A and 13B show pupil division when the imaging element 102 is driven in the +X direction.

With reference to FIGS. 12C and 12D, an example of pupil division at the central image height when the sensor shift-type image blur compensation unit 105 is displaced in the −X direction will be described. If the imaging element 102 is displaced in the −X direction, the exit pupil 400 also moves in the −X direction on the pupil plane. This is because an axis perpendicular to an imaging surface passing through a center of the imaging element 102 (corresponding to a vertical arrow extending from a central pixel) is shifted from an optical axis of the photographing optical system 101 by displacing the imaging element 102 in the −X direction. Therefore, on the exit pupil plane, all of the first pupil partial region 501 and the second pupil partial region 502 are expressed in a form of being moved in the exit pupil plane (to the left in FIGS. 12C and 12D) as shown in the upper parts of FIGS. 12C and 12D. The exit pupil 400 strictly becomes an elliptical shape conforming to the cosine fourth law, but it is expressed as a circle for simplicity of description in this example.

In FIG. 11C, although the exit pupil 400 moves in the −X direction, the vignetting caused by the holding frame 110 of the final group of the photographing optical system 101 indicated by a bold line does not occur. However, since the exit pupil 400 has moved in the −X direction, pupil division becomes unequal between left and right portions, and shading caused by vignetting occurs even at the central image height. In FIG. 12D, the exit pupil 400 moves in the −X direction and the vignetting caused by the holding frame 110 of the final group of the photographing optical system 101 occurs in the same manner as in FIG. 12C. In this case, an optical axis of the photographing optical system 101 relatively approaches a peripheral image height position of the imaging element 102 to be focused in FIG. 11D, and thus a vignetting amount is smaller than in FIG. 12B and pupil division is in a shape close to in FIG. 12C.

With reference to FIGS. 13A and 13B, an example of pupil division at the central image height and the peripheral image height (the +X direction) when the imaging element 102 of the sensor shift-type image blur compensation unit 105 is displaced in the +X direction will be described. If the imaging element 102 is displaced in the +X direction, the exit pupil 400 also moves in the +X direction on the pupil plane. This is because an axis perpendicular to an imaging surface passing through the center of the imaging element 102 (corresponding to a vertical arrow extending from a central pixel) is shifted from the optical axis of the photographing optical system 101 by displacing the imaging element 102 in the −X direction. Therefore, on the exit pupil plane, all of the first pupil partial region 501 and the second pupil partial region 502 are expressed in a form of being moved in the exit pupil plane (to the right in FIGS. 13A and 13B) as shown in the upper parts of FIGS. 13A and 13B. The exit pupil 400 is in a circular shape for simplicity of description in this example.

In FIG. 13A, although the exit pupil 400 moves in the +X direction, the vignetting caused by the holding frame 110 of the final group of the photographing optical system 101 indicated by a bold line does not occur. However, since the exit pupil 400 has moved in the +X direction, pupil division becomes unequal between left and right portions, and shading caused by vignetting occurs even at the central image height. In FIG. 13B, the optical axis of the photographing optical system 101 relatively moves away from the peripheral image height position of the imaging element 102 to be focused in FIG. 13A. As a result, vignetting caused by the holding frame 110 of the final group of the photographing optical system 101 largely occurs and the exit pupil 400 moves in the +X direction. In this case, unlike in FIG. 12B, although a vignetting amount decreases, the inhomogeneity of pupil division increases and the component ratio on the −X side among focal point detection signals become approximately zero. If defocus calculation using the shading compensation or the conversion coefficient K is performed under conditions corresponding to FIGS. 12C to 13B the same as the conditions of FIGS. 12A and 12B, accurate focal point detection is impossible and an in-focus state cannot be reached. For example, if FIGS. 12B and 12D showing an appearance of the peripheral image height (the +X direction) are viewed, the vignetting amount caused by the holding frame 110 is less in FIG. 12D. On the other hand, in the state of FIG. 12B, the vignetting amount caused by the holding frame 110 is larger than in FIG. 12D. That is, if a focal point detection frame is set at an image height in the +X direction in this manner, it is more difficult to receive the vignetting effect caused by the holding frame 110 when the imaging element 102 is placed at a position displaced in the −X direction as shown in FIG. 12D. The image blur compensation control unit 107 specifies a set image height of a focal point detection frame and a position of the image blur compensation optical system 109 at which vignetting by the holding frame 110 starts to occur on the basis of the tables of the shading correction coefficient SHD and the conversion coefficient K, and sets a driving amplitude center of the imaging element 102. Details of the setting of a driving amplitude center performed by the image blur compensation control unit 107 will be described below.

In FIGS. 10 to 13, an example in which the exit pupil distance D1 of the photographing optical system 101 is substantially the same as the set pupil distance Ds of the imaging element 102 is described. The imaging apparatus 1000 is in a lens-interchangeable method, and thus, in fact, a combination of D1>Ds or D1<Ds also occurs. In this case, a situation of vignetting is different from those in FIGS. 10 to 13. Therefore, for example, vignetting information covering the information of the exit pupil distance D1 of the photographing optical system 101 is held in the storage unit 106, and a condition for realizing optimum focal point detection is selected in the setting of a driving amplitude center.

(Setting Processing for Driving Amplitude Center)

Figure 14:
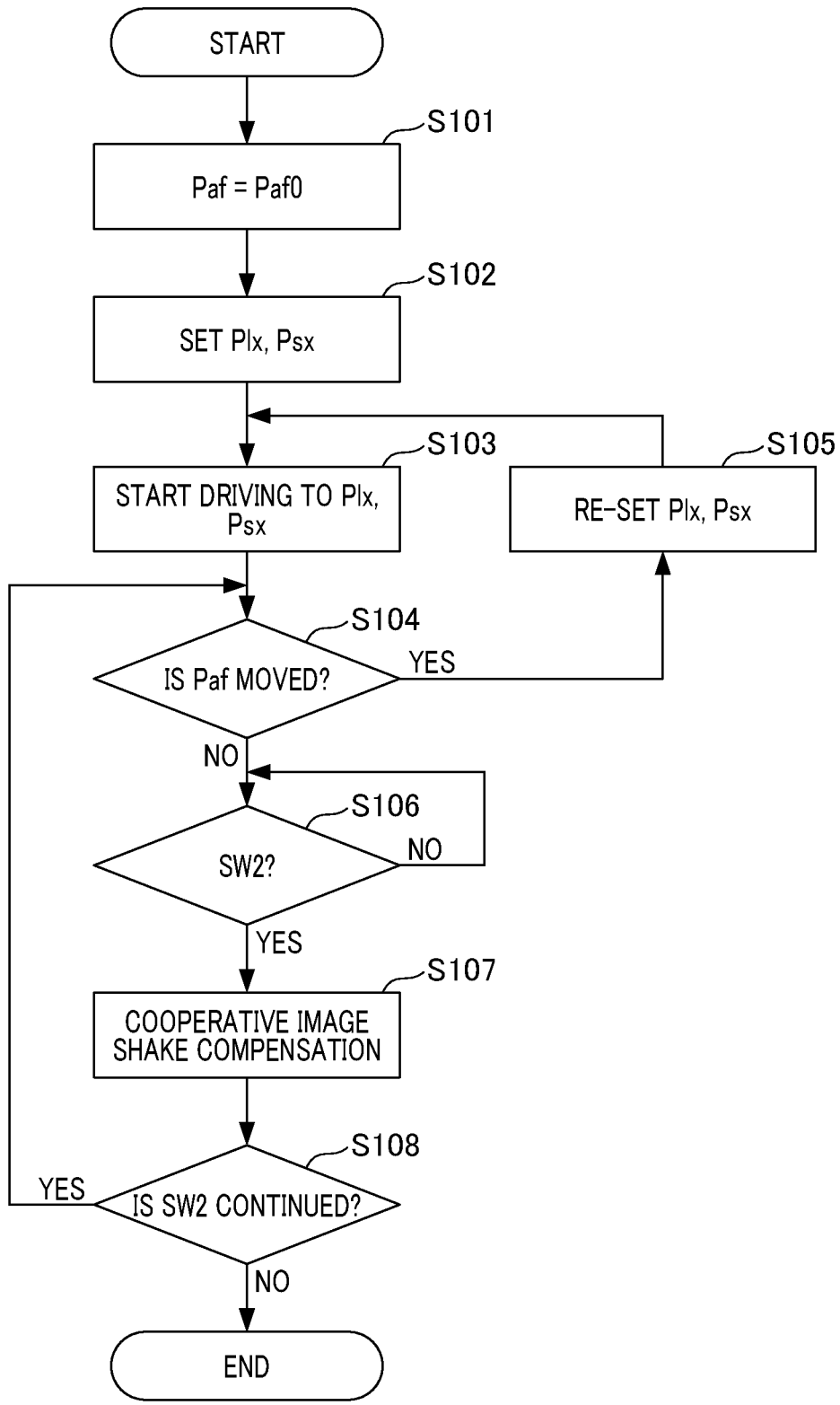
FIG. 14 is a diagram which describes setting processing for driving amplitude centers of a lens shift-type image blur compensation unit and a sensor shift-type image blur compensation unit.

FIG. 14 is a flowchart which describes setting processing of driving amplitude centers of the lens shift-type image blur compensation unit and the sensor shift-type image blur compensation unit by the image blur compensation control unit.

Processing shown in FIG. 14 is executed after the imaging apparatus 1000 is in a live view state and a release button is pressed halfway (photometry/focal point detection start instruction SW1) to photograph a still image. In FIG. 14, still image continuous shooting is described as an example. In the still image continuous shooting, it is necessary that all photographed images are in the in-focus state, and focal point detection is executed every time between photographed frames. In the present embodiment, the image blur compensation control unit 107 sets a position at which a vignetting amount is equal to or less than a predetermined value during a period in which focal point detection is performed as a center position of the driving amplitude, and performs drive control of the image blur compensation unit. As a result, it is possible to prevent an effect of the vignette in the focal point detection.

In S101, the image blur compensation control unit 107 refers to a position Paf0 of a focal point detection frame, which is currently set, and stores it as a position Paf of a focal point detection frame. The position Paf of a focal point detection frame may also be set by a photographer. In addition, Paf may also be set by determining a main subject (for example, a face, or the like) from a live view image and the like by a so-called focal point detection frame tracking operation.

Next, the image blur compensation control unit 107 sets a driving amplitude center Plx of the image blur compensation optical system 109 of the lens shift-type image blur compensation unit 104, and a driving amplitude center Psx of the imaging element 102 of the sensor shift-type image blur compensation unit 105 in S102. Plx is defined as a distance from a stroke center of the image blur compensation optical system 109. In addition, Psx is defined as a distance from a stroke center of the imaging element 102.

FIG. 15 is a diagram which describes the Plx and Psx.

FIG. 15A shows the same state as in FIG. 12D. In an example shown in FIG. 15A, a pixel at the peripheral image height (the +X direction) is a center position Paf of a focal point detection frame in an example shown in FIG. 15A. That is, a range indicated by a bold line is a width of a focal point detection frame centered on Paf. In the example shown in FIG. 15A, stroke ends 111 and 112 of the imaging element 102 and the image blur compensation optical system 109 are defined. In the example shown in FIG. 15A, the stroke ends are mechanical ends, but the stroke ends may also be virtual ends (electric ends) on drive control. It is known that vignetting caused by the holding frame 110 does not occur in a pixel positioned at Paf under a condition corresponding to FIG. 15A. However, if the imaging element 102 is displaced in the +X direction, vignetting caused by the holding frame HO starts and proceeds. That is, since a condition at this time is the same as that in FIG. 12B, the imaging element 102 is a state which is displaced by a distance corresponding to a white arrow in FIG. 15A. In the imaging apparatus 1000, if S102 of FIG. 14 is a first time, this condition is not satisfied, and a displacement amount in which a center position Ps of the imaging element 102 is displaced from an optical axis is zero. However, if general processing of S102 of an $N^{th}$ time is performed, the displacement amount is not zero.

FIG. 15B shows a state in which the position P1 of the optical axis of the image blur compensation optical system 109 and the position Ps of the imaging element 102 reach the driving amplitude centers Plx and Psx. In the present embodiment, the image blur compensation control unit 107 drives a current center position (the center position showing in FIG. 15A) Ps of the imaging element 102 to Psx. Addition, the image blur compensation control unit 107 drives the position P1 of the optical axis of the image blur compensation optical system 109 from the position P1 of the optical axis showing in FIG. 15A to Plx by a distance corresponding to a white arrow in FIG. 15B. That is, a vignetting effect is equal to or less than a predetermined magnitude in a state of FIG. 15B. Specifically, pupil division is substantially equally performed and the vignetting amount caused by the holding frame 110 is equal to or less than a predetermined amount.

In S102 of FIG. 14, for example, the image blur compensation control unit 107 sets the driving amplitude centers Plx and Psx such that a vignetting amount is equal to or less than a predetermined amount as shown in FIG. 15B. In this example, the image blur compensation control unit 107 sets Plx and Psx in accordance with a focal distance of the photographing optical system 101. For example, sufficient image blur compensation is possible even if a stroke amount for driving the imaging element 102 is small under conditions in which the focal distance is short. That is, image blur compensation by the imaging element 102 is more sensitive to image blur compensation. On the other hand, image blur compensation by the image blur compensation optical system 109 is more sensitive to image blur compensation under conditions in which the focal distance is long. Therefore, the image blur compensation control unit 107 sets Plx and Psx in accordance with sensitivity of image blur compensation. More specifically, the image blur compensation control unit 107 is set to drive amplitude center movement in a system with low sensitivity of image blur compensation first. The image blur compensation control unit 107 maintains the driving amplitude center in a system with high sensitivity of image blur compensation, and causes the driving amplitude center to move to a position at which the vignetting effect caused by the holding frame 110 is equal to or less than a predetermined magnitude in the system with low sensitivity of image blur compensation. Accordingly, it is possible to suppress large variations in view angle. The position at which the vignetting effect is equal to or less than a predetermined magnitude is determined by mechanical and electric strokes of each of the lens shift-type image blur compensation unit 104 and the sensor shift-type image blur compensation unit 105. More specifically, the driving amplitude centers Plx and Psx at which a large vignetting change does not occur even if an image blur compensation drive is performed with an electric stroke which can drive are adopted. A degree of the large vignetting change may be determined by the imaging apparatus 1000 in accordance with a selection of a user as to whether focal point detection is prioritized, and may also be changed or determined in accordance with a setting situation of a focal point detection frame position.

Next, in S103, the image blur compensation control unit 107 starts driving towards new driving amplitude centers Plx and Psx set in S102. That is, the image blur compensation control unit 107 starts driving from a state shown in FIG. 15A to a state shown in FIG. 15B.

However, if the image blur compensation optical system 109 starts driving in the −X direction, it causes variation in view angle. If the position Paf of a focal point detection frame is set by a photographer, a subject intended by the photographer is often present at the position Paf of a focal point detection frame. In this case, a sudden variation in view angle becomes a movement against the intention of the photographer, and sometimes a main subject is driven out of view angle. Therefore, the image blur compensation control unit 107 gradually executes driving to the driving amplitude centers Plx and Psx at a driving speed such that the variation in view angle is equal to or less than a predetermined magnitude. As a result, it is possible to prevent occurrence of the sudden variation in view angle. At the time of driving to the driving amplitude centers Plx and Psx, driving for normal image blur compensation is superimposed and executed, and does not give a large influence on a basic image blur compensation operation. If the position Paf of a focal point detection frame is automatically set by the imaging apparatus 1000 and the Paf moves from moment to moment, the image blur compensation control unit 107 may execute the following driving. The image blur compensation control unit 107, for example, executes driving such that, while allowing a sudden variation in view angle, the position Paf of a focal point detection frame appropriately moves by this variation to continue focus tracking.

In S104, the image blur compensation control unit 107 determines whether the position Paf of a focal point detection frame moves according to the instruction of a photographer or a focal point detection frame tracking operation. If it is determined that Paf moves, the processing proceeds to S105. If it is determined that Paf does not move, the processing proceeds to S106.

In S105, the image blur compensation control unit 107 re-sets the driving amplitude centers Plx and Psx in the same manner as the processing in S102 described above on the basis of the position Paf of a focal point detection frame determined to move in S104. Then, the processing returns to S103. In S106, the image blur compensation control unit 107 determines whether a full press operation of a release button (an imaging start instruction: SW2) is detected. If SW2 is detected, the processing proceeds to S107. If SW2 is not detected, the processing returns to S106.

In S107, the image blur compensation control unit 107 executes image blur compensation during an exposure period for imaging. That is, the image blur compensation control unit 107 performs drive control of the image blur compensation unit based on a shake detection signal in response to a photographing start operation being performed. Accordingly, the lens shift-type image blur compensation unit 104 and the sensor shift-type image blur compensation unit 105 cooperate with each other to perform image blur compensation for imaging (hereinafter, described as "cooperative image blur compensation"). In general, the cooperative image blur compensation during an exposure period performs, unlike image blur compensation executed until SW2 is detected, driving such that there is almost no compensation reminder with respect to a detected image blur. In the present embodiment, the movement to the driving amplitude centers Plx and Psx starts in accordance with the position Paf of a focal point detection frame in S103, but the cooperative image blur compensation starts and the movement to the driving amplitude centers is stopped in S107. On the other hand, image blur compensation executed during focal point detection (between SW1 and SW2 detections) may perform a stroke limit to some extent such that a stroke amount of the image blur compensation unit is not used up. If the exposure period is completed, the processing proceeds to S108.

In S108, the image blur compensation control unit 107 determines whether SW2 continues. This determination processing is processing for confirming an intention of continuous shooting. If SW2 continues, the processing returns to S104 to execute a focal point detection operation for a next frame and an image blur compensation operation giving priority to the focal point detection operation. If SW2 does not continue, the present flow ends and a series of image blur compensation drive operations are completed.

The focal point detection processing described with reference to FIG. 7 is continued until SW2 is detected in S106 from a start time point of a processing flow of FIG. 14. Meanwhile, the shading compensation coefficient SHD and the conversion coefficient K to be referred to also change in accordance with the movement to the driving amplitude centers Plx and Psx, which is started in S103. The focal point detection unit 103 refers to appropriate shading compensation coefficient SHD and conversion coefficient K from a table for the movement to the driving amplitude centers Plx and Psx.

In the present embodiment, the processing flow of FIG. 14 is set to start from SW1, but the present invention is not limited thereto, but, for example, may directly move to Plx and Psx on the basis of the position Paf of a focal point detection frame obtained at the time of power-on. In this case, if this operation is completed by the time of a live view screen display, a photographer can start photographing without being perplexed by variations in view angle due to the movement of a driving amplitude center. The movement operation to Plx and Psx can also be applied in the moving image photographing mode. Since an image blur compensation drive in the moving image photographing requires more stroke amounts than in the still image photographing, it is desirable that the movement of a driving amplitude center starting in S103 is executed at a slower speed. In addition, an imaging apparatus having two different image blur compensation units are adopted in the present embodiment, but the present invention is not limited thereto, and a driving amplitude center of one image blur compensation unit may be set to a position at which vignetting caused by a holding frame is small and a stroke required for image blur compensation is obtained.

According to an imaging apparatus of the present embodiment, since driving amplitude center control of image blur compensation is performed on the basis of vignetting information such that a vignetting effect of a focal point detection signal is equal to or less than a predetermined value, it is possible to suppress the vignetting effect on focal point detection.

(The Other Embodiments)

The present invention provides a program for realizing one or more functions of the embodiments described above to a system or an apparatus via a network or a storage medium, and can also be realized in processing in which one or more processors in a computer of this system or apparatus read and execute the program. In addition, the present invention can also be realized by a circuit for realizing one or more functions (for example, ASIC).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-149668 filed on Aug. 2, 2017, which are hereby incorporated by reference herein in its entirety.

What is claimed is:

1. An imaging apparatus comprising:
a storage unit; and
a controller which operates on the basis of data stored in the storage unit,
wherein the controller comprises:
a focal point detection unit configured to perform focal point detection on the basis of a phase difference between a plurality of image signals obtained by photoelectric conversion of light fluxes each passing through different pupil partial regions of an imaging optical system;
an image blur compensation unit configured to compensate for image blur; and
a control unit configured to set a position at which a vignetting amount occurring in a light flux passing through the imaging optical system is equal to or less than a predetermined value during a period in which the focal point detection is performed by the focal point detection unit as a center position of a driving amplitude to perform drive control of the image blur compensation unit.

2. The imaging apparatus according to claim 1,
wherein the storage unit is configured to store information on vignetting occurring in the light flux passing through the imaging optical system in accordance with a position driven by the image blur compensation unit, and
the control unit sets a position at which the vignetting amount is equal to or less than a predetermined value as a center position of the driving amplitude on the basis of the information on vignetting.

3. The imaging apparatus according to claim 2,
wherein the information on vignetting includes information on an intensity ratio between the plurality of image signals.

4. The imaging apparatus according to claim 2,
wherein the information on vignetting includes information of a conversion coefficient which converts a phase difference between the plurality of image signals into a defocus amount.

5. The imaging apparatus according to claim 2,
wherein the information on vignetting includes information of a light flux shape on an exit pupil plane of the imaging optical system in accordance with a state of the vignetting.

6. The imaging apparatus according to claim 1,
wherein the vignetting amount detected during a period in which the focal point detection is performed is a vignetting amount related to vignetting of a focal point detection region on which the focal point detection is performed.

7. The imaging apparatus according to claim 1,
wherein the control unit sets a center position of the driving amplitude in accordance with a focal point distance of the imaging optical system.

8. The imaging apparatus according to claim 1,
wherein the control unit causes the image blur compensation unit to drive to the set center position of the driving amplitude at a driving speed at which variation in view angle is equal to or less than a predetermined magnitude.

9. The imaging apparatus according to claim 1,
wherein the control unit sets a center position of the driving amplitude when the imaging apparatus is powered on.

10. The imaging apparatus according to claim 1,
wherein the control unit performs drive control of the image blur compensation unit based on a shake detection signal in response to a photographing start operation, and resets the center position of the driving amplitude if the center position of the focal point detection region on which the focal point detection is performed is changed.

11. The imaging apparatus according to claim 1,
wherein the image blur compensation unit is a lens of the imaging optical system or an imaging element for outputting the plurality of image signals by photoelectrically converting the light flux.

12. A control method of an imaging apparatus having an image blur compensation unit which compensates for image blur, the control method comprising:
performing focal point detection on the basis of a phase difference between a plurality of image signals obtained by photoelectric conversion of light fluxes each passing through different pupil partial regions of an imaging optical system; and setting a position at which a vignetting amount occurring in a light flux passing through the imaging optical system is equal to or less than a predetermined value during a period in which the focal point detection is performed as a center position of a driving amplitude to perform drive control of the image blur compensation unit.

13. A non-transitory storage medium on which is stored a computer program for making a computer execute a control method, the control method comprising:

performing focal point detection on the basis of a phase difference between a plurality of image signals obtained by photoelectric conversion of light fluxes each passing through different pupil partial regions of an imaging optical system; and setting a position at which a vignetting amount occurring in a light flux passing through the imaging optical system is equal to or less than a predetermined value during a period in which the focal point detection is performed as a center position of a driving amplitude to perform drive control of the image blur compensation unit.

* * * * *